US010515993B2

(12) United States Patent
Field et al.

(10) Patent No.: US 10,515,993 B2
(45) Date of Patent: Dec. 24, 2019

(54) STACKED PHOTODETECTOR ASSEMBLIES

(71) Applicant: HI LLC, Los Angeles, CA (US)

(72) Inventors: Ryan Field, Culver City, CA (US);
Husam Katnani, Braintree, MA (US);
Bruno Do Valle, Brighton, MA (US);
Rong Jin, Acton, MA (US); Jacob Dahle, Arlington, MA (US)

(73) Assignee: HI LLC, Los Angeles, CA (US)

( * ) Notice: Subject to any disclaimer, the term of this patent is extended or adjusted under 35 U.S.C. 154(b) by 5 days.

(21) Appl. No.: 16/283,730

(22) Filed: Feb. 22, 2019

(65) Prior Publication Data
US 2019/0355773 A1 Nov. 21, 2019

Related U.S. Application Data

(60) Provisional application No. 62/743,893, filed on Oct. 10, 2018, provisional application No. 62/687,659, filed on Jun. 20, 2018, provisional application No. 62/673,065, filed on May 17, 2018.

(51) Int. Cl.
*H01L 27/146* (2006.01)
*H01L 31/107* (2006.01)
*A61B 5/04* (2006.01)

(52) U.S. Cl.
CPC .. *H01L 27/14634* (2013.01); *H01L 27/14623* (2013.01); *H01L 27/14629* (2013.01); *H01L 31/107* (2013.01); *A61B 5/04001* (2013.01)

(58) Field of Classification Search
CPC ......... H01L 27/14634; H01L 27/14629; H01L 27/14623; H01L 31/107
See application file for complete search history.

(56) References Cited

U.S. PATENT DOCUMENTS

| 4,963,727 | A |   | 10/1990 | Cova |
| 5,853,370 | A |   | 12/1998 | Chance et al. |
| 5,929,982 | A | * | 7/1999 | Anderson ............... H03G 3/24 |
|           |   |   |         | 250/214 AG |

(Continued)

FOREIGN PATENT DOCUMENTS

| WO | 2008/144831 | 12/2008 |
| WO | 2012/135068 | 10/2012 |

(Continued)

OTHER PUBLICATIONS

Puszka et al., Time-resolved diffuse optical tomography using fast-gated single-photon avalanche diodes, Biomedical optics express, 2013, vol. 4, No. 8, pp. 1351-1365 (Year: 2013).*
Takai et al., Single-Photon Avalanche Diode with Enhanced NIR-Sensitivity for Automotive LIDAR Systems, Sensors, 2016, 16(4): 459, pp. 1-9 (Year: 2016).*
Bellis et al., Photon counting imaging: the DigitalAPD, Society of Photo-Optical Instrumentation Engineers (SPIE) Conference Series, Feb. 2006, vol. 6068, pp. 111-120.

(Continued)

*Primary Examiner* — Earl N Taylor
(74) *Attorney, Agent, or Firm* — ALG Intellectual Property, LLC

(57) ABSTRACT

An exemplary stacked photodetector assembly includes a first wafer and a second wafer bonded to the first wafer. The first wafer includes a SPAD and has a thickness T1 configured to minimize absorption by the first wafer of photons included in light incident upon the first wafer while the SPAD is in a disarmed state. The second wafer has a thickness T2 configured to provide structural support for the first wafer. The stacked photodetector assembly includes a fast gating circuit electrically coupled to the SPAD and configured to arm and disarm the SPAD.

21 Claims, 35 Drawing Sheets

(56) References Cited

U.S. PATENT DOCUMENTS

| | | | | |
|---|---|---|---|---|
| 6,240,309 | B1 | 5/2001 | Yamashita et al. | |
| 6,384,663 | B2 * | 5/2002 | Cova | G01J 1/44 250/214 A |
| 6,541,752 | B2 | 4/2003 | Zappa et al. | |
| 6,683,294 | B1 | 1/2004 | Herbert et al. | |
| 7,507,596 | B2 | 3/2009 | Yaung et al. | |
| 7,547,872 | B2 | 6/2009 | Niclass et al. | |
| 7,667,400 | B1 * | 2/2010 | Goushcha | H01L 27/1446 313/523 |
| 7,705,284 | B2 | 4/2010 | Inoue et al. | |
| 7,714,292 | B2 * | 5/2010 | Agarwal | H01L 27/14658 250/370.01 |
| 8,026,471 | B2 | 9/2011 | Itzler | |
| 8,082,015 | B2 | 12/2011 | Yodh et al. | |
| 8,115,170 | B2 | 2/2012 | Stellari et al. | |
| 8,168,934 | B2 | 5/2012 | Niclass et al. | |
| 8,633,431 | B2 | 1/2014 | Kim | |
| 8,637,875 | B2 * | 1/2014 | Finkelstein | H01L 31/0336 257/184 |
| 8,754,378 | B2 | 6/2014 | Prescher et al. | |
| 8,817,257 | B2 | 8/2014 | Nerve | |
| 9,012,860 | B2 | 4/2015 | Nyman et al. | |
| 9,041,136 | B2 | 5/2015 | Chia | |
| 9,058,081 | B2 | 6/2015 | Baxter | |
| 9,076,707 | B2 | 7/2015 | Harmon | |
| 9,101,279 | B2 | 8/2015 | Ritchey et al. | |
| 9,160,949 | B2 | 10/2015 | Zhang et al. | |
| 9,176,241 | B2 | 11/2015 | Frach | |
| 9,178,100 | B2 * | 11/2015 | Webster | H01L 27/1443 |
| 9,190,552 | B2 | 11/2015 | Brunel et al. | |
| 9,201,138 | B2 | 12/2015 | Eisele et al. | |
| 9,209,320 | B1 * | 12/2015 | Webster | H01L 31/02027 |
| 9,257,523 | B2 * | 2/2016 | Schneider | H01L 27/0255 |
| 9,257,589 | B2 | 2/2016 | Niclass et al. | |
| 9,299,732 | B2 * | 3/2016 | Webster | H01L 27/14603 |
| 9,299,873 | B2 | 3/2016 | Mazzillo et al. | |
| 9,312,401 | B2 * | 4/2016 | Webster | H01L 31/107 |
| 9,316,735 | B2 | 4/2016 | Baxter | |
| 9,331,116 | B2 * | 5/2016 | Webster | H01L 27/14612 |
| 9,368,487 | B1 | 6/2016 | Su et al. | |
| 9,401,448 | B2 | 7/2016 | Bienfang et al. | |
| 9,407,796 | B2 | 8/2016 | Dinten et al. | |
| 9,419,635 | B2 | 8/2016 | Kumar et al. | |
| 9,431,439 | B2 | 8/2016 | Soga et al. | |
| 9,442,201 | B2 | 9/2016 | Schmand et al. | |
| 9,449,377 | B2 | 9/2016 | Sarkar et al. | |
| 9,450,007 | B1 | 9/2016 | Motta et al. | |
| 9,466,631 | B2 | 10/2016 | Fallica et al. | |
| 9,476,979 | B2 | 10/2016 | Drader et al. | |
| 9,478,579 | B2 * | 10/2016 | Dai | H01L 27/14609 |
| 9,535,157 | B2 | 1/2017 | Caley et al. | |
| 9,574,936 | B2 | 2/2017 | Heinonen | |
| 9,625,580 | B2 | 4/2017 | Kotelnikov et al. | |
| 9,627,569 | B2 | 4/2017 | Harmon | |
| 9,639,063 | B2 | 5/2017 | Dutton et al. | |
| 9,640,704 | B2 | 5/2017 | Frey et al. | |
| 9,658,158 | B2 * | 5/2017 | Renna | G01N 21/6454 |
| 9,659,980 | B2 | 5/2017 | McGarvey et al. | |
| 9,671,284 | B1 | 6/2017 | Dandin | |
| 9,685,576 | B2 | 6/2017 | Webster | |
| 9,702,758 | B2 | 7/2017 | Nouri | |
| 9,728,659 | B2 | 8/2017 | Hirigoyen et al. | |
| 9,741,879 | B2 | 8/2017 | Frey | |
| 9,753,351 | B2 | 9/2017 | Eldada | |
| 9,767,246 | B2 | 9/2017 | Dolinsky et al. | |
| 9,768,211 | B2 | 9/2017 | Harmon | |
| 9,773,930 | B2 | 9/2017 | Motta et al. | |
| 9,812,438 | B2 | 11/2017 | Schneider et al. | |
| 9,831,283 | B2 | 11/2017 | Shepard et al. | |
| 9,851,302 | B2 | 12/2017 | Mattioli Della Rocca et al. | |
| 9,867,250 | B1 * | 1/2018 | Powers | H03K 5/08 |
| 9,869,753 | B2 | 1/2018 | Eldada | |
| 9,881,963 | B1 | 1/2018 | Chen et al. | |
| 9,882,003 | B1 | 1/2018 | Aharoni | |
| 9,886,095 | B2 | 2/2018 | Pothier | |
| 9,899,544 | B1 | 2/2018 | Mazzillo et al. | |
| 9,899,557 | B2 | 2/2018 | Muscara' et al. | |
| 9,939,316 | B2 | 4/2018 | Scott et al. | |
| 9,939,536 | B2 | 4/2018 | O'Neill et al. | |
| 9,946,344 | B2 | 4/2018 | Ayaz et al. | |
| D817,553 | S | 5/2018 | Aaskov et al. | |
| 10,016,137 | B1 * | 7/2018 | Yang | A61B 5/0097 |
| D825,112 | S | 8/2018 | Saez | |
| 10,056,415 | B2 * | 8/2018 | Na | H01L 27/14698 |
| 10,141,458 | B2 * | 11/2018 | Zhang | H01L 31/02241 |
| 10,157,954 | B2 * | 12/2018 | Na | H01L 27/1443 |
| 10,158,038 | B1 * | 12/2018 | Do Valle | H01L 31/107 |
| 10,219,700 | B1 * | 3/2019 | Yang | G02B 26/06 |
| 10,256,264 | B2 * | 4/2019 | Na | H01L 27/14698 |
| 2005/0061986 | A1 * | 3/2005 | Kardynal | B82Y 20/00 250/370.01 |
| 2013/0032713 | A1 * | 2/2013 | Barbi | H01J 37/26 250/307 |
| 2013/0221221 | A1 * | 8/2013 | Bouzid | G01J 1/44 250/338.4 |
| 2013/0342835 | A1 | 12/2013 | Blacksberg | |
| 2014/0027607 | A1 * | 1/2014 | Mordarski | G01J 1/44 250/206 |
| 2014/0191115 | A1 * | 7/2014 | Webster | H01L 31/107 250/214 R |
| 2014/0211194 | A1 | 7/2014 | Pacala et al. | |
| 2014/0291481 | A1 * | 10/2014 | Zhang | H04N 5/361 250/208.1 |
| 2015/0041627 | A1 * | 2/2015 | Webster | H01L 27/14634 250/208.2 |
| 2015/0054111 | A1 * | 2/2015 | Niclass | H01L 27/1446 257/438 |
| 2015/0192677 | A1 | 7/2015 | Yu et al. | |
| 2015/0200222 | A1 * | 7/2015 | Webster | H01L 31/107 250/208.1 |
| 2015/0293224 | A1 | 10/2015 | Eldada et al. | |
| 2015/0333095 | A1 * | 11/2015 | Fallica | H01L 27/14634 250/208.1 |
| 2015/0364635 | A1 | 12/2015 | Bodlovic et al. | |
| 2016/0049765 | A1 | 2/2016 | Eldada | |
| 2016/0099371 | A1 * | 4/2016 | Webster | H01L 31/1075 250/208.1 |
| 2016/3011998 | | 4/2016 | Moore | |
| 2016/0150963 | A1 | 6/2016 | Roukes et al. | |
| 2016/0161600 | A1 | 6/2016 | Eldada et al. | |
| 2016/0181302 | A1 | 6/2016 | McGarvey et al. | |
| 2016/0218236 | A1 * | 7/2016 | Dhulla | H01L 31/107 |
| 2016/0278715 | A1 | 9/2016 | Yu et al. | |
| 2016/0341656 | A1 * | 11/2016 | Liu | G01N 21/6454 |
| 2016/0356718 | A1 * | 12/2016 | Yoon | G01N 21/6456 |
| 2016/0357260 | A1 | 12/2016 | Raynor et al. | |
| 2017/0030769 | A1 | 2/2017 | Clemens et al. | |
| 2017/0047372 | A1 | 2/2017 | McGarvey et al. | |
| 2017/0052065 | A1 | 2/2017 | Sharma et al. | |
| 2017/0118423 | A1 | 4/2017 | Zhou et al. | |
| 2017/0131143 | A1 * | 5/2017 | Andreou | G01J 1/44 |
| 2017/0139041 | A1 | 5/2017 | Drader et al. | |
| 2017/0141100 | A1 | 5/2017 | Tseng et al. | |
| 2017/0176579 | A1 | 6/2017 | Niclass et al. | |
| 2017/0176596 | A1 | 6/2017 | Shpunt et al. | |
| 2017/0179173 | A1 | 6/2017 | Mandai et al. | |
| 2017/0186798 | A1 * | 6/2017 | Yang | H01L 27/14634 |
| 2017/0202518 | A1 | 7/2017 | Furman et al. | |
| 2017/0265822 | A1 | 9/2017 | Du | |
| 2017/0276545 | A1 | 9/2017 | Henriksson | |
| 2017/0299700 | A1 | 10/2017 | Pacala et al. | |
| 2017/0303789 | A1 | 10/2017 | Tichauer et al. | |
| 2017/0314989 | A1 | 11/2017 | Mazzillo et al. | |
| 2017/0363467 | A1 | 12/2017 | Clemens et al. | |
| 2018/0003821 | A1 | 1/2018 | Imai | |
| 2018/0019268 | A1 * | 1/2018 | Zhang | H01L 27/1443 |
| 2018/0026147 | A1 * | 1/2018 | Zhang | H01L 31/02241 257/292 |
| 2018/0027196 | A1 | 1/2018 | Yang et al. | |
| 2018/0033895 | A1 * | 2/2018 | Mazzillo | G01J 1/44 |
| 2018/0039053 | A1 | 2/2018 | Kremer et al. | |
| 2018/0045816 | A1 | 2/2018 | Jarosinski et al. | |
| 2018/0062345 | A1 | 3/2018 | Bills et al. | |

(56) References Cited

U.S. PATENT DOCUMENTS

| | | | |
|---|---|---|---|
| 2018/0081061 A1 | 3/2018 | Mandai et al. | |
| 2018/0089848 A1 | 3/2018 | Yang et al. | |
| 2018/0090526 A1* | 3/2018 | Mandai | H01L 27/14603 |
| 2018/0090536 A1* | 3/2018 | Mandai | H01L 27/14603 |
| 2018/3006904 | 3/2018 | Pan et al. | |
| 2018/0102442 A1* | 4/2018 | Wang | G02B 1/005 |
| 2018/0103528 A1 | 4/2018 | Moore | |
| 2018/0167606 A1* | 6/2018 | Cazaux | G01S 7/4914 |
| 2018/0175230 A1* | 6/2018 | Droz | H01L 27/14609 |
| 2018/0217261 A1* | 8/2018 | Wang | G01S 17/89 |
| 2019/0006399 A1* | 1/2019 | Otake | H01L 27/1463 |

FOREIGN PATENT DOCUMENTS

| | | |
|---|---|---|
| WO | 2013/066959 | 5/2013 |
| WO | 2015/052523 | 4/2015 |
| WO | 2016/166002 | 10/2016 |
| WO | 2017/004663 | 1/2017 |
| WO | 2017/130682 | 8/2017 |
| WO | 2017/150146 | 9/2017 |
| WO | 2017/203936 | 11/2017 |
| WO | 2018/007829 | 1/2018 |

OTHER PUBLICATIONS

Cambie et al., Every photon counts: understanding and optimizing photon paths in luminescent solar concentrator-based photomicroreactors (LSC-PMs), React. Chem. Eng., 2017, 2, 561-566.

Dalla Mora et al., Fast-Gated Single-Photon Avalanche Diode for Wide Dynamic Range Near Infrared Spectroscopy, IEEE Journal of Selected Topics in Quantum Electronics, vol. 16, No. 4, Jul./Aug. 2010, 1023-1030.

Dalla Mora et al., Memory effect in silicon time-gated single-photon avalanche diodes, http://dx.doi.org/10.1063/1.4915332, Journal of Applied Physics 117, 114501, 2015, 1-7.

Harmon et al., Compound Semiconductor SPAD Arrays, LightSpin Technologies, http://www.lightspintech.com/publications.html.

Lee et al., High-Performance Back-Illuminated Three-Dimensional Stacked Single-Photon Avalanche Diode Implemented in 45-nm CMOS Technology, IEEE Journal of Selected Topics in Quantum Electronics 6, 1-9 (2018).

Maruyama, et al., A 1024×8, 700-ps. Time-Gated SPAD Line Sensor for Planetary Surface Exploration With Laser Raman Spectroscopy and LIBS, IEEE Journal of Solid-State Circuits, vol. 49, No. 1, Jan. 2014, 179-189.

* cited by examiner

STACKED PHOTODETECTOR ASSEMBLIES

RELATED APPLICATIONS

The present application claims priority under 35 U.S.C. § 119(e) to U.S. Provisional Patent Application No. 62/673,065, filed on May 17, 2018, to U.S. Provisional Patent Application No. 62/687,659, filed on Jun. 20, 2018, and to U.S. Provisional Patent Application No. 62/743,893, filed on Oct. 10, 2018. These applications are incorporated herein by reference in their respective entireties.

BACKGROUND INFORMATION

Detecting neural activity in the brain is useful for medical diagnostics, imaging, neuroengineering, brain-computer interfacing, and a variety of other diagnostic and consumer-related applications. For example, it may be desirable to detect neural activity in the brain of a patient to determine if a particular region of the brain has been impacted by reduced blood irrigation, a hemorrhage, or any other type of damage. As another example, it may be desirable to detect neural activity in the brain of a user and computationally decode the detected neural activity into commands that can be used to control various types of consumer electronics (e.g., by controlling a cursor on a computer screen, changing channels on a television, turning lights on, etc.).

A photodetector capable of detecting a single photon (i.e., a single particle of optical energy) is an example of a non-invasive detector that can be used to detect neural activity within the brain. For example, an array of these sensitive photodetectors can record photons that reflect off of tissue within the brain in response to application of one or more light pulses. Based on the time it takes for the photons to be detected by the photodetectors, neural activity and other attributes of the brain can be determined or inferred.

A photodetector that employs a semiconductor-based single-photon avalanche diode (SPAD) is capable of capturing individual photons with very high time-of-arrival resolution (a few tens of picoseconds). When photons are absorbed by a SPAD, their energy frees bound charge carriers (electrons and holes) that then become free-carrier pairs. In the presence of an electric field created by a reverse bias voltage applied to the diode, these free-carriers are accelerated through a region of the SPAD referred to as the multiplication region. As the free carriers travel through the multiplication region, they collide with other carriers bound in the atomic lattice of the semiconductor, thereby generating more free carriers through a process called impact ionization. These new free-carriers also become accelerated by the applied electric field and generate yet more free-carriers. This avalanche event can be detected and used to determine an arrival time of the photon.

In order to enable detection of a single photon, a SPAD is biased with a reverse bias voltage having a magnitude greater than the magnitude of its breakdown voltage, which is the bias level above which free-carrier generation can become self-sustaining and result in a runaway avalanche. This biasing of the SPAD is referred to as arming the device. When the SPAD is armed, a single free carrier pair created by the absorption of a single photon can create a runaway avalanche resulting in an easily detectable macroscopic current.

Unfortunately, photodetectors that employ semiconductor-based SPADs can suffer from a non-ideality referred to as a "memory effect." Memory effect occurs when photons are absorbed in a substrate (e.g., a silicon substrate) of a semiconductor-based SPAD while the SPAD is disarmed. The absorbed photons create charge carriers that later diffuse into an active region (e.g., an avalanche region or a multiplication region) of the SPAD after the SPAD is armed. This may cause an undesirable noise event.

Studies have shown that the memory effect can be almost entirely eliminated by biasing a deep junction of the SPAD such that carriers are prevented from diffusing into the active region. However, this solution is undesirable because it involves additional bias circuitry and adds complexity to the photodetector.

BRIEF DESCRIPTION OF THE DRAWINGS

The accompanying drawings illustrate various embodiments and are a part of the specification. The illustrated embodiments are merely examples and do not limit the scope of the disclosure. Throughout the drawings, identical or similar reference numbers designate identical or similar elements.

DETAILED DESCRIPTION

Stacked photodetector assemblies configured to minimize memory effect are described herein. The stacked photodetector assemblies described herein each include a SPAD and a fast gating circuit electrically coupled to the SPAD and configured to arm and disarm the SPAD. The stacked photodetector assemblies described herein also each include a first wafer and a second wafer bonded together in a stacked configuration. The first wafer includes the SPAD and has a thickness configured to minimize absorption of photons included in light incident upon the first wafer while the SPAD is in a disarmed state. The second wafer has a thickness configured to provide structural support for the first wafer. In some examples, as described herein, the fast gating circuit is included in the second wafer. In some alternative examples, the fast gating circuit is included together with the SPAD in the first wafer. In these alternative examples, the second wafer may include no circuitry and only provide structural support for the first wafer or alternatively may act as an interposer, including connectors to the SPAD circuit out to other external circuits.

The stacked photodetector assemblies described herein may be used to fast gate a SPAD while minimizing noise events caused by memory effect. As described above, memory effect may occur when photons are absorbed in a substrate (e.g., silicon substrate) of a device that create charge carriers that later diffuse into an active region of the SPAD. Memory effect may be more noticeable for light with near infrared wavelengths, as a penetration depth of near infrared light into silicon can reach hundreds of microns. The stacked photodetector assemblies described herein may allow the first wafer including the SPAD to be thinned to a thickness that minimizes absorption of photons. This, in turn, may minimize memory effect and increase signal-to-noise ratio of photodetection, thereby improving spatial and temporal resolution compared to conventional photodetectors. These and other advantages of the stacked photodetector assemblies described herein will be described in more detail below.

Figure 1:
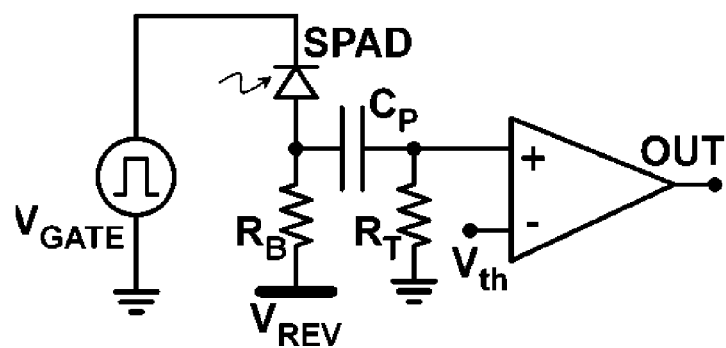
FIG. 1 shows a conventional SPAD architecture known in the art.

FIG. 1 shows a conventional SPAD architecture known in the art that may be used in a conventional photodetector that is not fast-gated. In FIG. 1, a gating signal generated by a voltage source $V_{GATE}$ is applied to a SPAD (e.g., an output node of the SPAD). The gating signal switches between ground and an excess bias voltage. When the gating signal is equal to ground, the voltage across the SPAD is less than or equal to a breakdown voltage of the SPAD, which means that the SPAD is in a disarmed or "off" state in which the SPAD cannot avalanche. When the gating signal is equal to the excess bias voltage, the voltage across the SPAD is greater than the breakdown voltage of the SPAD, which means that the SPAD is in an armed or "on" state in which a photon can initiate a detectable avalanche within the SPAD.

While the SPAD is in the armed state, a photon incident upon the SPAD may initiate an avalanche within the SPAD. When the avalanche occurs, current starts flowing through capacitor CP and resistors RB and RT, which increases the voltage at the SPAD anode. This, in turn, reduces the voltage across the SPAD. When the voltage across the SPAD decreases below the breakdown voltage of the SPAD, the avalanche stops. This process is called passive quenching.

A number of disadvantages are associated with the conventional SPAD architecture shown in FIG. 1. For example, because the gating of the SPAD is performed directly by the voltage source $V_{GATE}$, the time it takes to arm the SPAD is not instantaneous. Rather, the time it takes to arm the SPAD depends on the rise time of the gating signal supplied by the voltage source $V_{GATE}$ (i.e., the time it takes for the gating signal to go from ground to the excess bias voltage). If a photon hits the SPAD during the rise time phase of the gating signal, the SPAD may not yet be armed and therefore may not detect the photon. Hence, any data collected by the photodetector during the rise time of the gating signal is corrupted and must be discarded.

Figure 2:
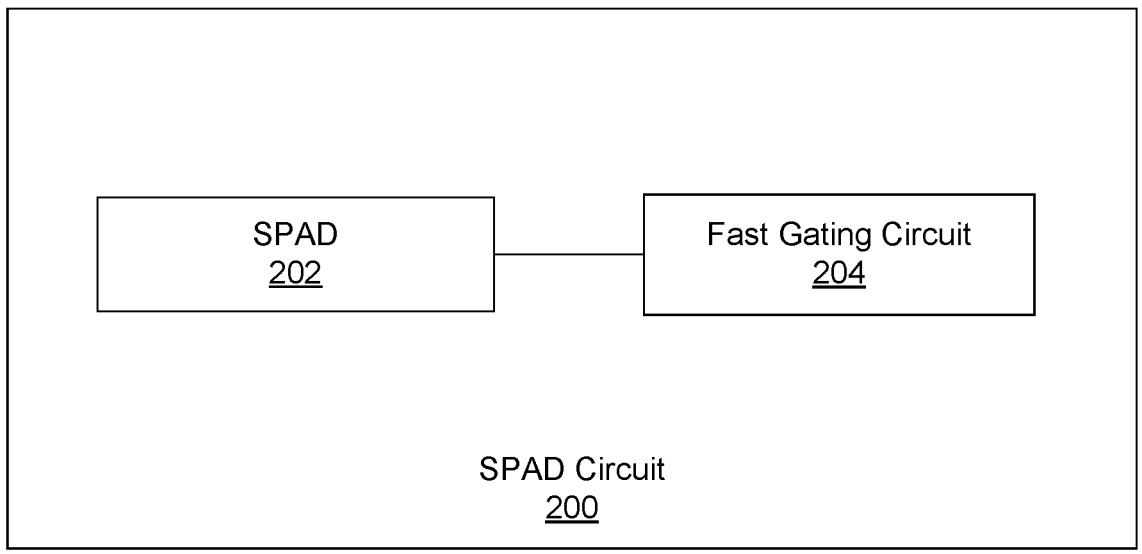
FIG. 2 illustrates an exemplary SPAD circuit that may be used in the stacked photodetector assemblies described herein.

In contrast, FIG. 2 shows a block diagram of an exemplary SPAD circuit 200 that includes a SPAD 202 and a fast gating circuit 204 configured to gate SPAD 202 relatively quickly (e.g., almost instantaneously) compared to conventional SPAD architectures, such as the conventional SPAD architecture of FIG. 1. SPAD 202 may be implemented by any suitable semiconductor-based SPAD. Fast gating circuit 204 may be implemented by any suitable combination of electrical components configured to fast gate SPAD 202.

For example, fast gating circuit 204 may include a capacitor that is pre-charged with a bias voltage before a command is provided to arm SPAD 202. Gating SPAD 202 with a capacitor instead of with an active voltage source, such as is done in the conventional SPAD architecture of FIG. 1, has a number of advantages and benefits.

For example, a SPAD that is gated with a capacitor may be armed practically instantaneously compared to a SPAD that is gated with an active voltage source. This is because the capacitor is already charged with the bias voltage when a command is provided to arm the SPAD. The sharper (i.e., faster) rise time provided by the photodetector architectures described herein may allow for improved depth resolution (i.e., the SPAD may be armed with greater precision, which improves the ability to time the arming of the SPAD with the time it is expected for a photon to take to reflect off a target located at a desired depth within the brain) and decreased noise (i.e., bad data that has to be discarded because it is collected before the SPAD completely transitions to the armed state).

Exemplary implementations of fast gating circuit 204, such as a circuit that includes a capacitor configured to gate SPAD 202 and other configurations that may be used in connection with the assemblies and methods described herein, are described herein.

Figure 3:
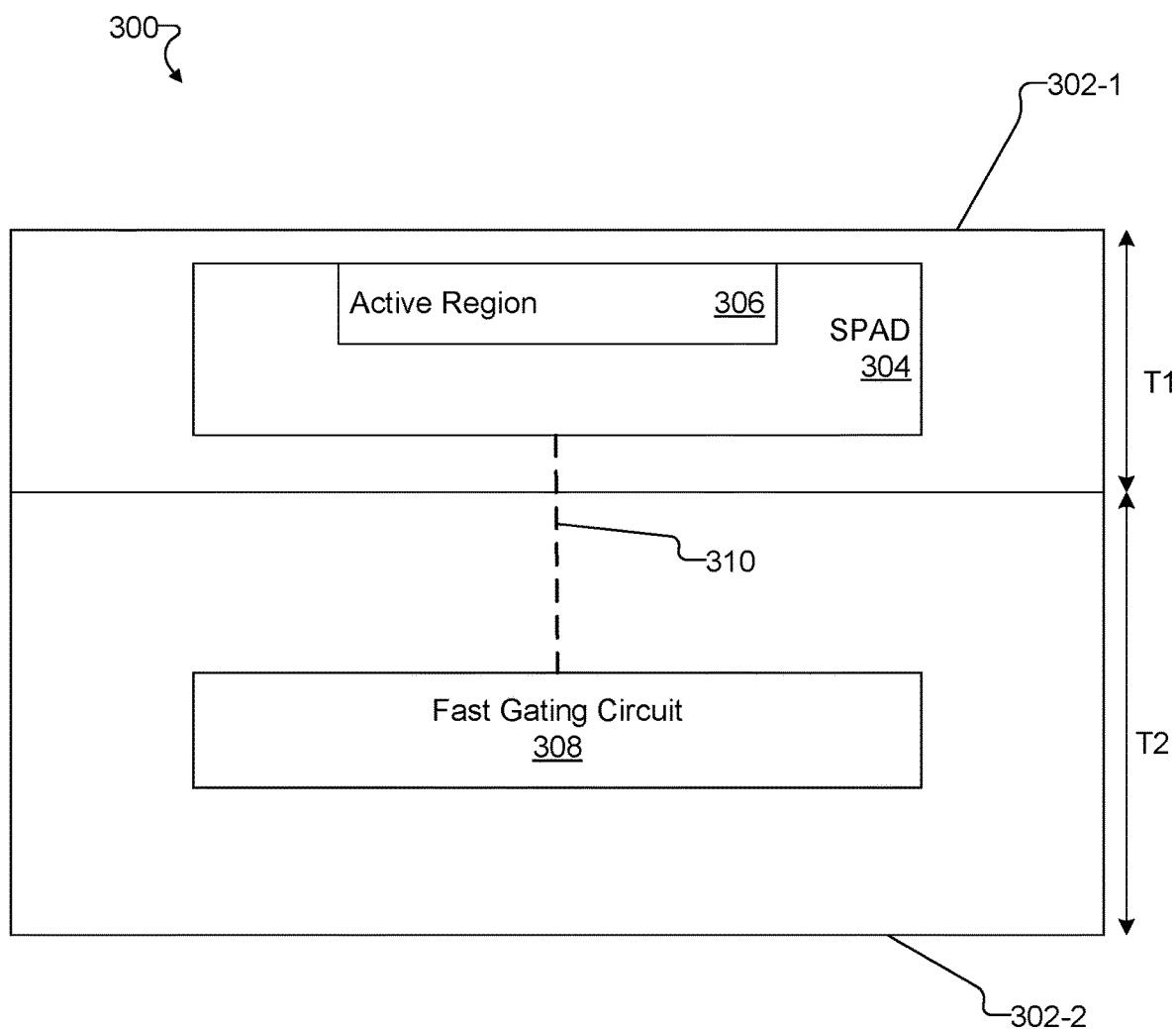
FIGS. 3-9 illustrate exemplary stacked photodetector assemblies according to principles described herein.

FIG. 3 illustrates an exemplary stacked photodetector assembly 300. Stacked photodetector assembly 300 may be a backside illuminated SPAD device, with circuitry and connectors for the SPAD arranged underneath the SPAD. Stacked photodetector assembly 300 may be an exemplary architecture for a SPAD circuit such as SPAD circuit 200. Stacked photodetector assembly 300 includes wafers 302-1 and 302-2 (collectively "wafers 302") in a stacked configuration. Wafers 302 may be stacked in any suitable manner for three-dimensional (3D) integrated circuits. For example, wafers 302 may be stacked using a wafer-to-wafer or chip-to-wafer bonding process.

The stacked configuration may allow wafer 302-1 to be thinned to a thickness, shown as T1 in FIG. 3, that minimizes absorption of photons outside of the active region to minimize the memory effect. A conventional, unstacked wafer may have a thickness that allows for structural integrity, which may be on the order of hundreds of microns. A wafer with such thickness may absorb photons in a substrate while a SPAD on the wafer is in a disarmed state, which generates charge carriers in the active region/substrate that may later diffuse to an active region of the SPAD and result in memory effect. In contrast, the stacked configuration allows wafer 302-2 to provide structural support, so wafer 302-1 may be thinned to any suitable thickness T1, such as less than 100 microns, less than 10 microns, 2-5 microns, or any such thickness.

As shown, wafer 302-1 includes a SPAD 304, which may be similar to SPAD 202 shown in SPAD circuit 200. Wafer 302-1 may have a thickness T1 configured to minimize absorption of photons included in light incident upon wafer 302-1 while SPAD 304 is in a disarmed state. For example, the thickness T1 of wafer 302-1 may be less than 100 microns, 10 microns, 3-4 microns or any other suitable thickness. Wafer 302-2 may have a thickness, shown as T2 in FIG. 3, configured to provide structural support for wafer 302-1. For example, wafer 302-2 may have a thickness T2 on the order of hundreds of microns, such as more than 250 microns, or any other suitable thickness to provide structural support. The structural support that wafer 302-2 provides wafer 302-1 may allow wafer 302-1 to have a thickness T1 that minimizes absorption of photons (e.g., photons included in near infrared light) and thus minimizes memory effect.

As shown, SPAD 304 includes an active region 306 (e.g., an avalanche region, a multiplication region, etc.). Active region 306 is a portion of SPAD 304 that absorbs photons that are to be detected by SPAD 304 as described herein.

Wafer 302-2 includes a fast gating circuit 308, which may be similar to fast gating circuit 204 of SPAD circuit 200. As shown, SPAD 304 and fast gating circuit 308 are electrically coupled by a connector 310. Connector 310 may be implemented by any suitable number of wires, interconnects, through-silicon vias (TSVs), etc. as may serve a particular implementation.

As shown (though not to scale), wafer 302-2 is thicker than wafer 302-1, such that wafer 302-2 may provide structural support to wafer 302-1, while the thickness T1 of wafer 302-1 is configured to minimize absorption of photons. As described above, in some examples, wafer 302-1 may have a thickness T1 on the order of ten microns or less, while wafer 302-2 may have a thickness T2 on the order of hundreds of microns, such as 250 microns or greater. For example, wafer 302-2 may have a thickness T2 around 750 microns.

Figure 4:
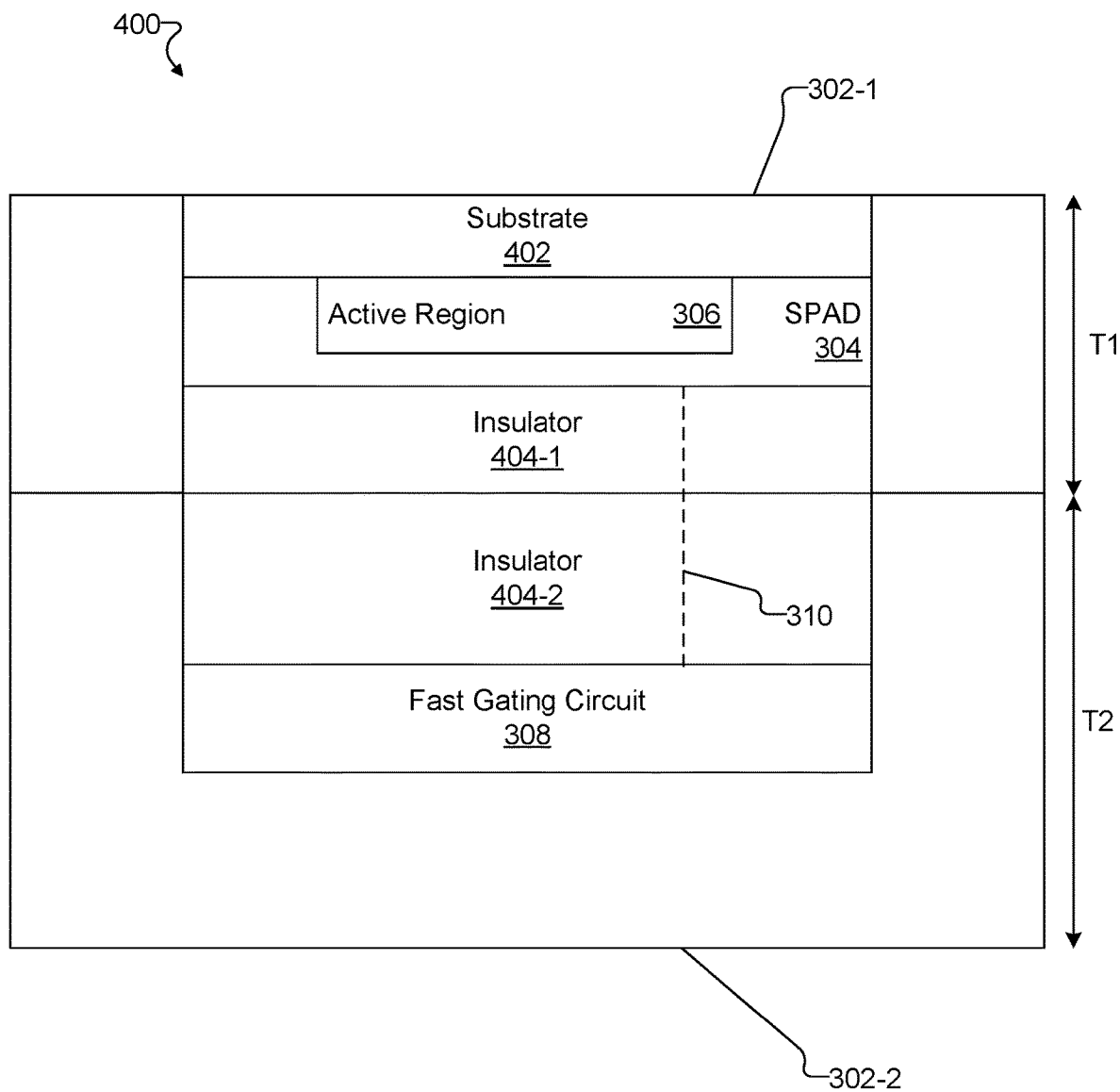

FIG. 4 shows an exemplary implementation 400 of stacked photodetector assembly 300. Implementation 400 includes wafers 302 (shown as wafer 302-1 and wafer 302-2 in FIG. 4), SPAD 304 with active region 306, fast gating circuit 308, and connector 310 as described in connection with FIG. 3. Wafer 302-1 also includes a substrate layer 402 above SPAD 304 as well as an insulator layer 404-1 below SPAD 304. Wafer 302-2 includes fast gating circuit 308 and an insulator layer 404-2 above fast gating circuit 308.

As implementation 400 illustrates an exemplary backside illuminated SPAD assembly, wafer 302-1 and wafer 302-2 may be stacked in a face-to-face configuration, allowing substrate layer 402 to be thinned down to a few microns. Thus, wafer 302-1 may be fabricated to have a thickness T1 that is configured to minimize absorption of photons to minimize memory effect.

Between SPAD 304 and fast gating circuit 308 are insulator layers 404-1 and 404-2 (collectively "insulator layers 404") on both wafers 302. Insulator layers 404 may be layers of any suitable material that provide electrical insulation, such as oxide layers. Insulator layers 404 allow SPAD 304 to be electrically isolated from any other substrate (not shown) on wafer 302-2. As a result, though a thickness T2 of wafer 302-2 may provide structural support and also may allow for absorption of photons, the charge carriers generated by photons absorbed by wafer 302-2 are prevented from diffusing to SPAD 304 and active region 306, preventing a noise event from the memory effect.

Figure 5:
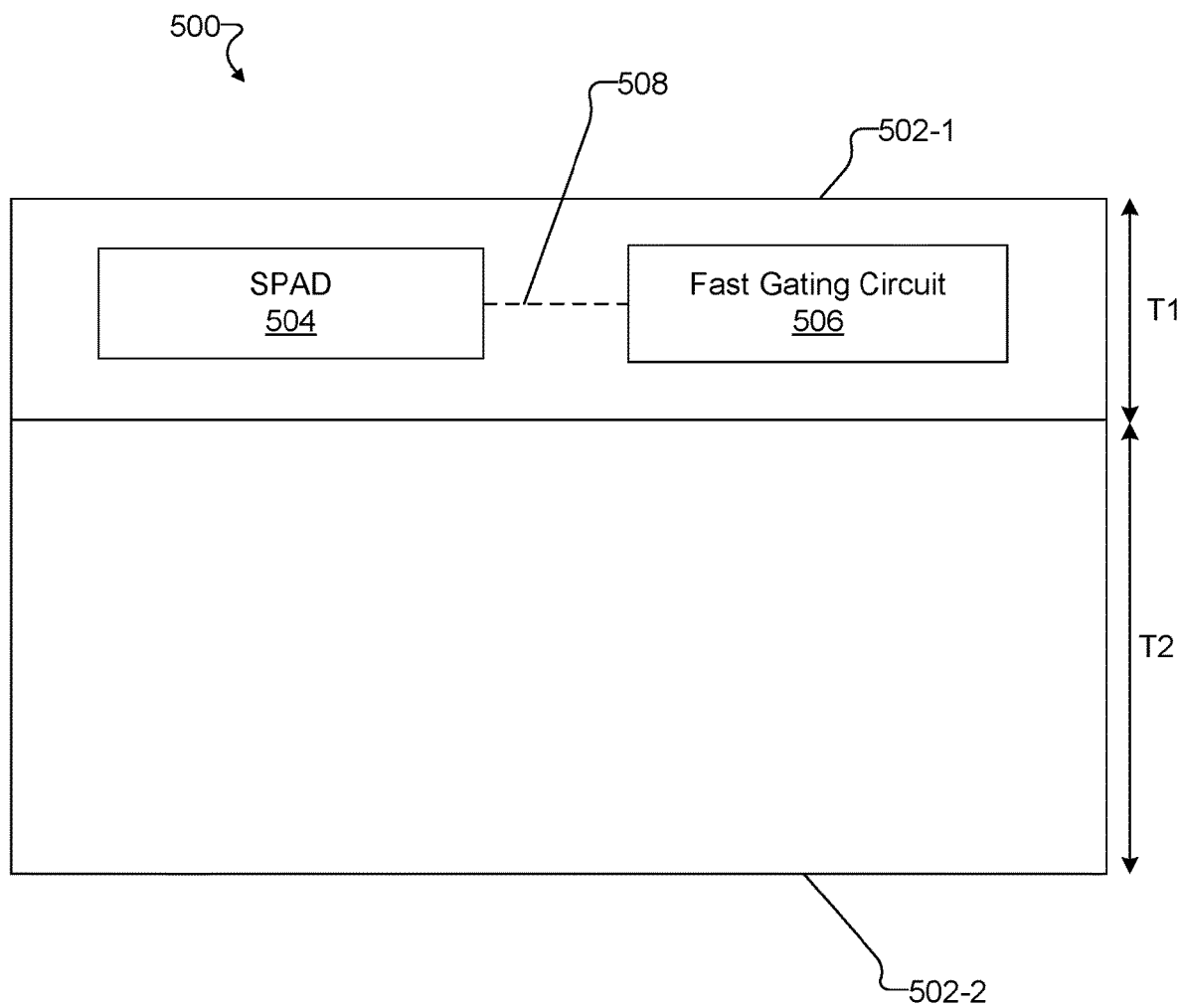

FIG. 5 illustrates another exemplary stacked photodetector assembly 500. Similar to stacked photodetector assembly 300, stacked photodetector assembly 500 includes wafers 502-1 and 502-2. However, in stacked photodetector assembly 500, wafer 502-1 includes a SPAD 504 and a fast gating circuit 506 coupled to each other by a connector 508. Wafer 502-2 is a handle wafer, with no electrical contacts made between wafer 502-1 and wafer 502-2. Wafer 502-2 still provides structural support for wafer 502-1 and has a thickness T2 configured to provide the structural support. Thus, wafer 502-1 may be thinned to a thickness T1 that is configured to minimize absorption of photons.

As wafer 502-2 is a handle wafer with no electrical contacts, a simple bonding process may be used to manufacture such an assembly. Additionally, as with photodetector assembly 400, as SPAD 504 is electrically isolated from any substrate layer in wafer 502-2, photons absorbed by wafer 502-2 may be prevented from diffusing to SPAD 504, minimizing noise events from memory effect.

Figure 6:
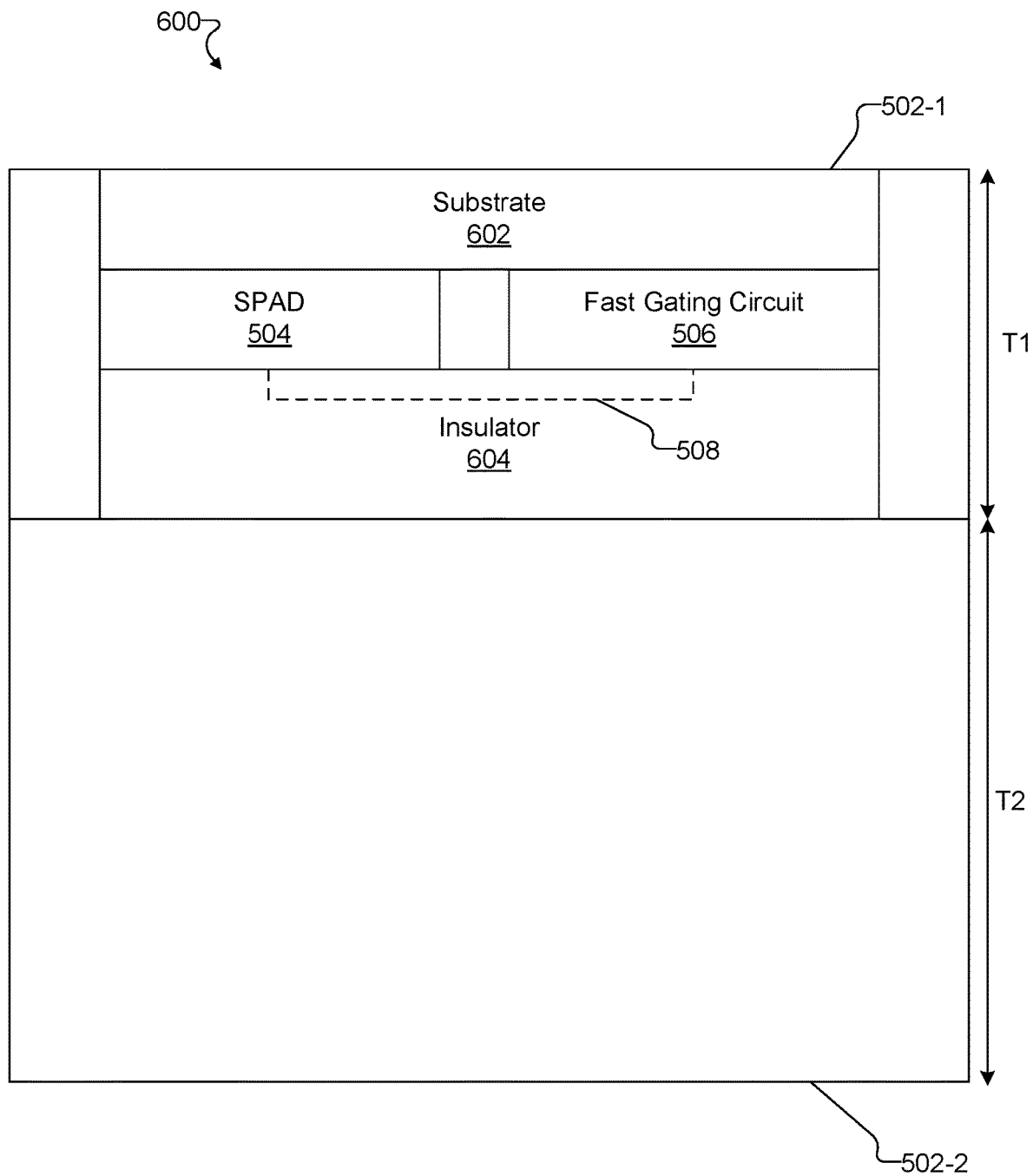

FIG. 6 shows an exemplary implementation 600 of stacked photodetector assembly 500. Implementation 600 includes wafers 502 (shown as wafer 502-1 and wafer 502-2 in FIG. 6), SPAD 504, fast gating circuit 506, and connector 508. In implementation 600, wafer 502-1 also includes a substrate layer 602 above SPAD 504 as well as an insulator layer 604 below SPAD 504. Wafer 502-2 is a handle wafer, with no electrical components. While wafer 502-2 is shown with no electrical components, in alternative examples, wafer 502-2 may be an interposer, with suitable electrical components to provide an interface to the SPAD circuit on wafer 502-1.

Implementation 600 may also be a backside illuminated SPAD device, with connector 508, coupling SPAD 504 to fast gating circuit 506, arranged underneath SPAD 504. Thus, similar to stacked photodetector assembly 300, wafers 502-1 and 502-2 may be bonded in a face-to-face configuration and substrate 602 thinned so that wafer 502-1 has a thickness T1 configured to minimize absorption of photons. As shown (though not to scale), wafer 502-2 is thicker than wafer 502-1 and provides structural support. While thickness T2 of wafer 502-2 may result in photons absorbed by wafer 502-2, insulator layer 604 may prevent the diffusion of charge carriers generated by absorbed photons to SPAD 504, minimizing noise events due to the memory effect.

Figure 7:
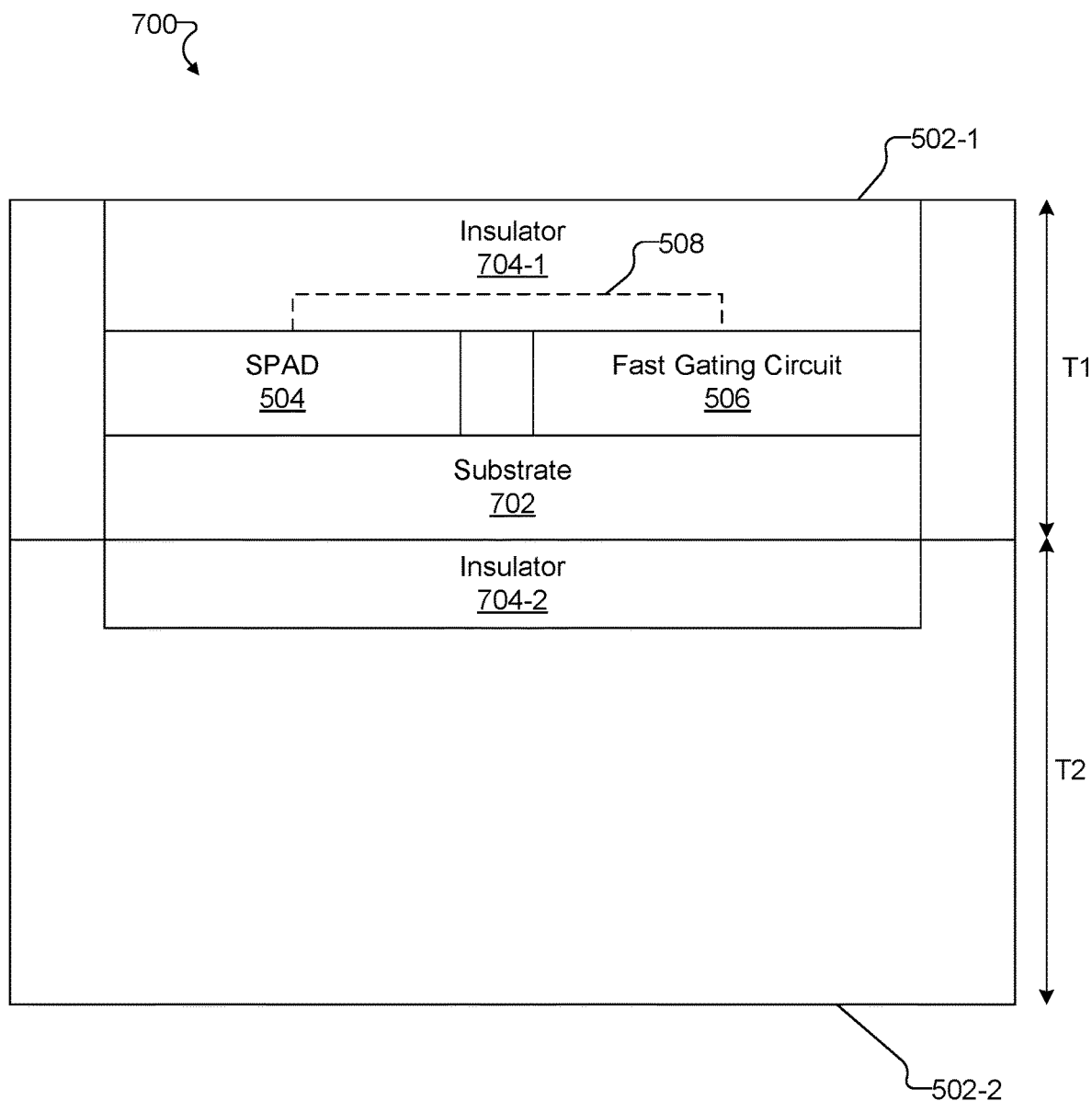

FIG. 7 shows another exemplary implementation 700 of stacked photodetector assembly 500. Implementation 700 includes wafers 502 (shown as wafer 502-1 and wafer 502-2 in FIG. 7), SPAD 504, fast gating circuit 506, and connector 508. Wafer 502-1 also includes a substrate layer 702 and an insulator layer 704-1, but unlike implementation 600, substrate layer 702 is below SPAD 504 and insulator layer 704-1 above SPAD 504. Wafer 502-2 is a handle wafer, with no electrical components, but including an insulator layer 704-2 to insulate SPAD 504 from the substrate of wafer 502-2. In other examples, insulator layer 704-2 may be a separate layer from wafers 502, such as a bonding or connection layer that also provides electrical insulation.

Implementation 700 may be a frontside illuminated SPAD device, with connector 508, coupling SPAD 504 to fast gating circuit 506, arranged above SPAD 504. Wafer 502-1 may be fabricated as a silicon on insulator (SOI) wafer with a thickness T1 configured to minimize absorption of photons in substrate layer 702. For example, wafer 502-1 may be grown, thinned, selected, manufactured, etc. to have the thickness T1.

While FIG. 7 shows insulator layer 704-1 to cover SPAD 504, in some examples, insulator layer 704-1 may have portions that are removed to allow for light, e.g., laser beam light, to more easily penetrate to SPAD 504. Additionally, as described above, while wafer 502-2 shows no electrical components, in alternative examples, wafer 502-2 may be an interposer with suitable components to allow for coupling to the SPAD circuit (e.g., SPAD 504 and fast gating circuit 506) on wafer 502-1.

Figure 8:
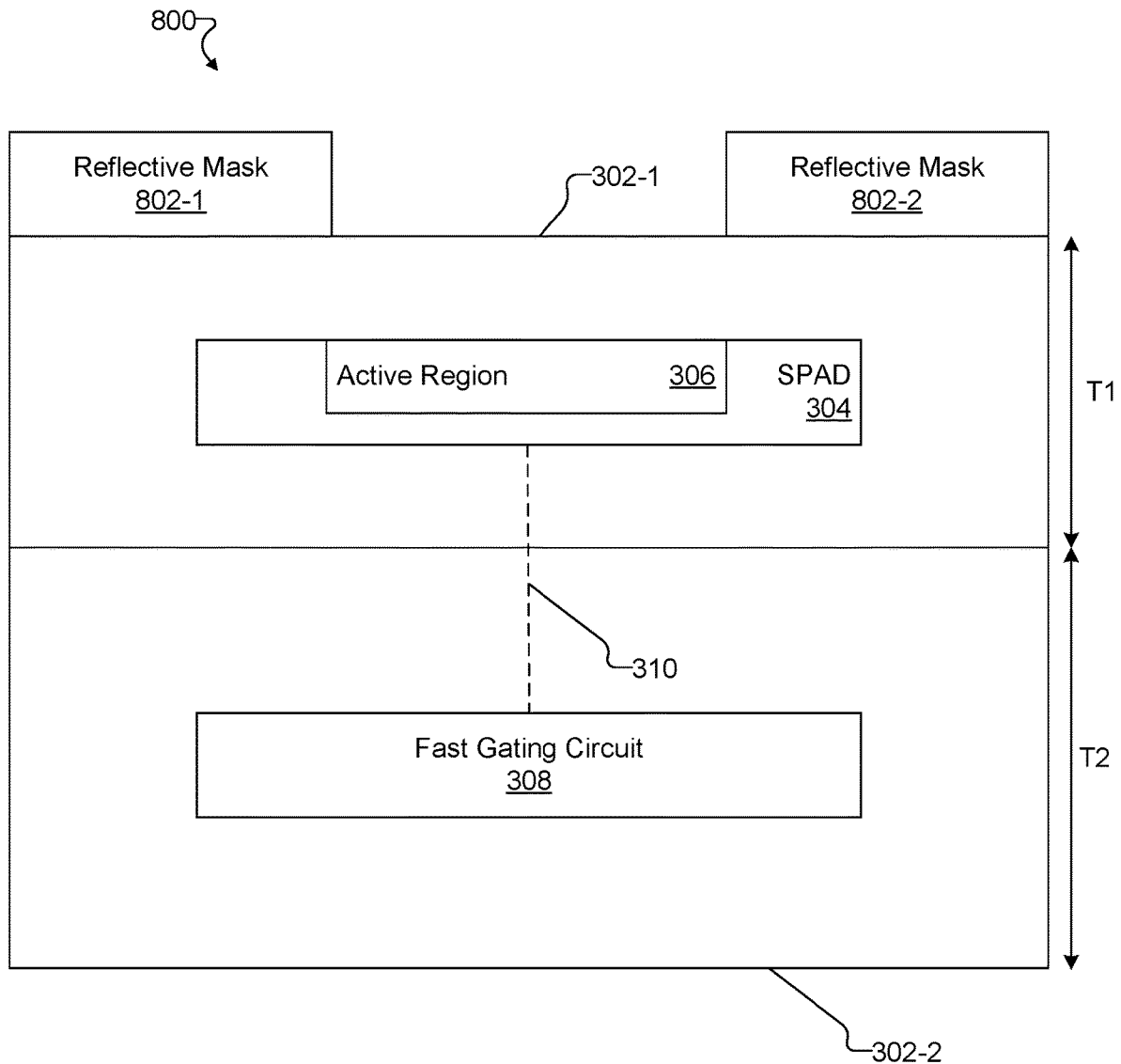

FIG. 8 shows another exemplary implementation 800 of stacked photodetector assembly 300. Implementation 800 includes wafers 302 (shown as wafer 302-1 and wafer 302-2 in FIG. 8), SPAD 304 with active region 306, fast gating circuit 308, and connector 310 coupling SPAD 304 and fast gating circuit 308.

Implementation 800 also includes a reflective mask 802 (shown as mask 802-1 and mask 802-2 in FIG. 8). Reflective mask 802 is arranged on top of wafer 302-1 and configured to reflect light away from wafer 302-1 except for light incident upon active region 306 of SPAD 304. Reflecting other light away from wafer 302-1 may further minimize absorption of photons by any substrate layer in either of wafers 302 and thus minimize noise events from memory effect. Reflective mask 802 may be implemented in any suitable manner, such as a layer of reflective metal or other such reflective material.

Implementation 800 shows one of various example implementations of stacked photodetector assemblies configured to further minimize absorption of photons outside of the active region of the SPAD and/or to focus light to the active region of the SPAD. Any other suitable configuration may additionally or alternatively be implemented. As another example, a stacked photodetector assembly may additionally or alternatively include microlenses configured to focus light to an active region of a SPAD.

Figure 9:
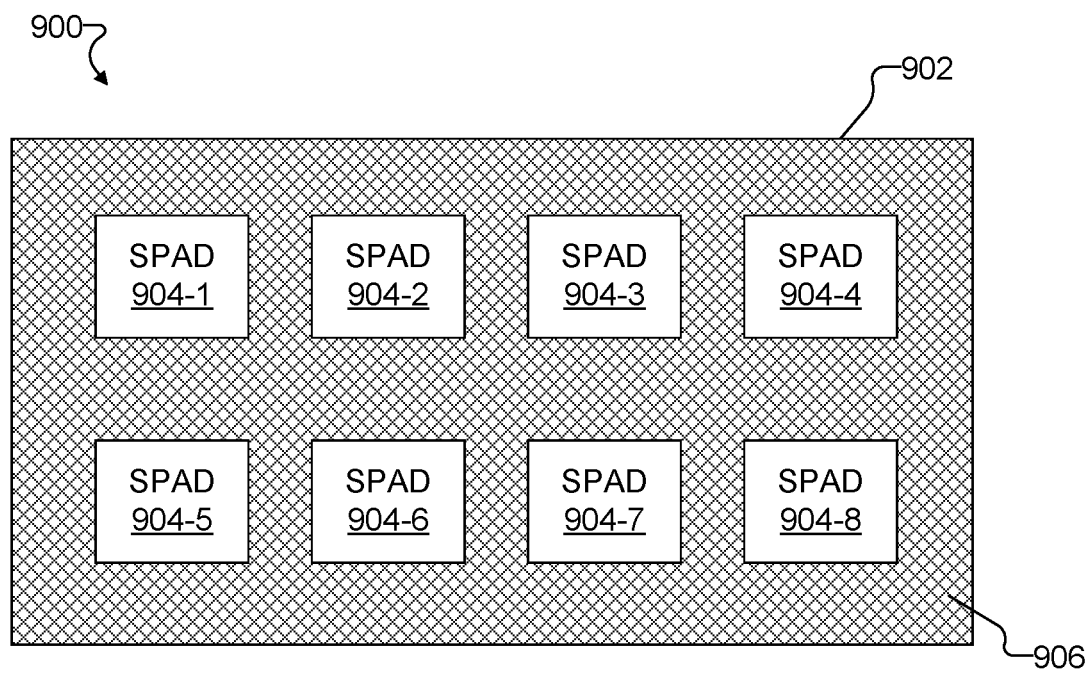

FIG. 9 shows an exemplary stacked photodetector assembly 900. Stacked photodetector assembly 900 is shown from a top down view of a plurality of SPADs such as those described in the stacked photodetector assemblies above, FIGS. 3-8. Thus, while stacked photodetector assemblies 300-800 illustrated wafers including single SPAD circuits, each stacked wafer assembly may include a plurality of SPADs and/or SPAD circuits.

Stacked photodetector assembly 900 shows a wafer 902 including a plurality of SPADs 904 (shown as SPAD 904-1 through 904-8 in FIG. 9). Stacked photodetector assembly 900 also includes a second wafer providing structural support, not shown. Stacked photodetector assembly 900 also includes reflective mask 906, which is a reflective layer configured to reflect light away except where light will most likely be incident upon active regions of SPADs 904.

Exemplary fast gating circuits and components of SPAD devices that can be used in the stacked photodetector assemblies will now be described.

Figure 10:
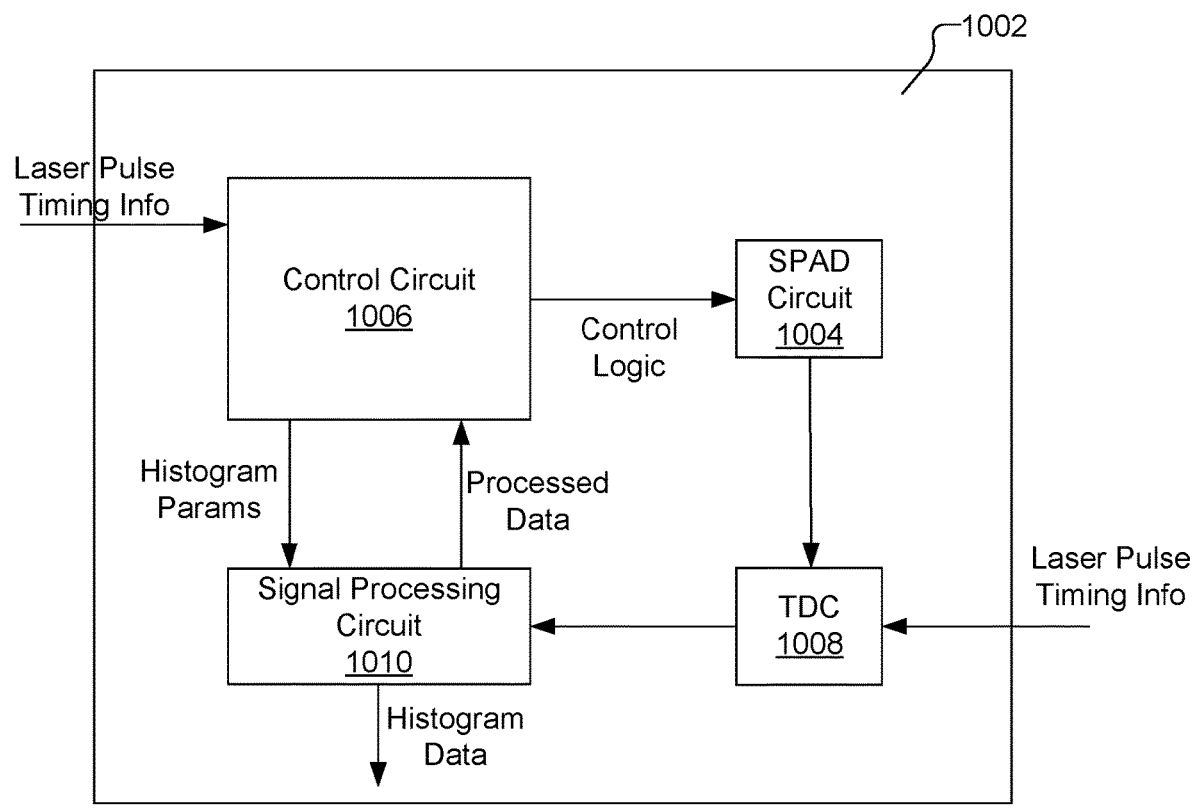
FIG. 10 illustrates various components included in an exemplary fast-gated photodetector according to principles described herein.

FIG. 10 illustrates various components included in an exemplary fast-gated photodetector 1002. As shown, photodetector 1002 includes a SPAD circuit 1004, a control circuit 1006, a time-to-digital converter (TDC) 1008, and a signal processing circuit 1010.

SPAD circuit 1004 may include a SPAD and a fast gating circuit (which may include various electrical components as described herein) configured to operate together to detect a photon incident upon the SPAD. As will be described below, SPAD circuit 1004 may generate an output pulse when SPAD circuit 1004 detects a photon. Various implementations of SPAD circuit 1004 are described herein.

Control circuit 1006 may be implemented by an application specific integrated circuit (ASIC) or any other suitable circuit configured to control an operation of various components within SPAD circuit 1004. For example, as will be described in more detail below, control circuit 1006 may output control logic that controls an operation of one or more switches within SPAD circuit 1004 to selectively charge a capacitor within SPAD circuit 1004 and put the SPAD included in the SPAD circuit 1004 in either an armed or a disarmed state. In some examples, control circuit 1006 may control a gate delay, which specifies a predetermined amount of time control circuit 1006 is to wait after an occurrence of a light pulse (e.g., a laser pulse) to put the SPAD in the armed state. To this end, control circuit 1006 may receive light pulse timing information, which indicates a time at which a light pulse occurs (e.g., a time at which the light pulse is applied to tissue within the brain). Control circuit 1006 may also control a programmable gate width, which specifies how long the SPAD is kept in the armed state before being disarmed.

Control circuit 1006 is further configured to control signal processing circuit 1010. For example, control circuit 1006 may provide histogram parameters to signal processing circuit 1010. Signal processing circuit 1010 may generate histogram data in accordance with the histogram parameters.

TDC 1008 is configured to measure a time difference between an occurrence of an output pulse generated by SPAD circuit 1004 and an occurrence of a light pulse. To this end, TDC 1008 may also receive the same light pulse timing information that control circuit 1006 receives. TDC 1008 may be implemented by any suitable circuitry as may serve a particular implementation.

Signal processing circuit 1010 is configured to perform one or more signal processing operations on data output by TDC 1008. For example, signal processing circuit 1010 may generate histogram data based on the data output by TDC 1008 and in accordance with histogram parameters provided by control circuit 1006. To illustrate, signal processing circuit 1010 may generate, store, transmit, compress, analyze, decode, and/or otherwise process histograms based on the data output by TDC 1008. In some examples, signal processing circuit 1010 may provide processed data to control circuit 1006, which may use the processed data in any suitable manner.

Figure 11A:
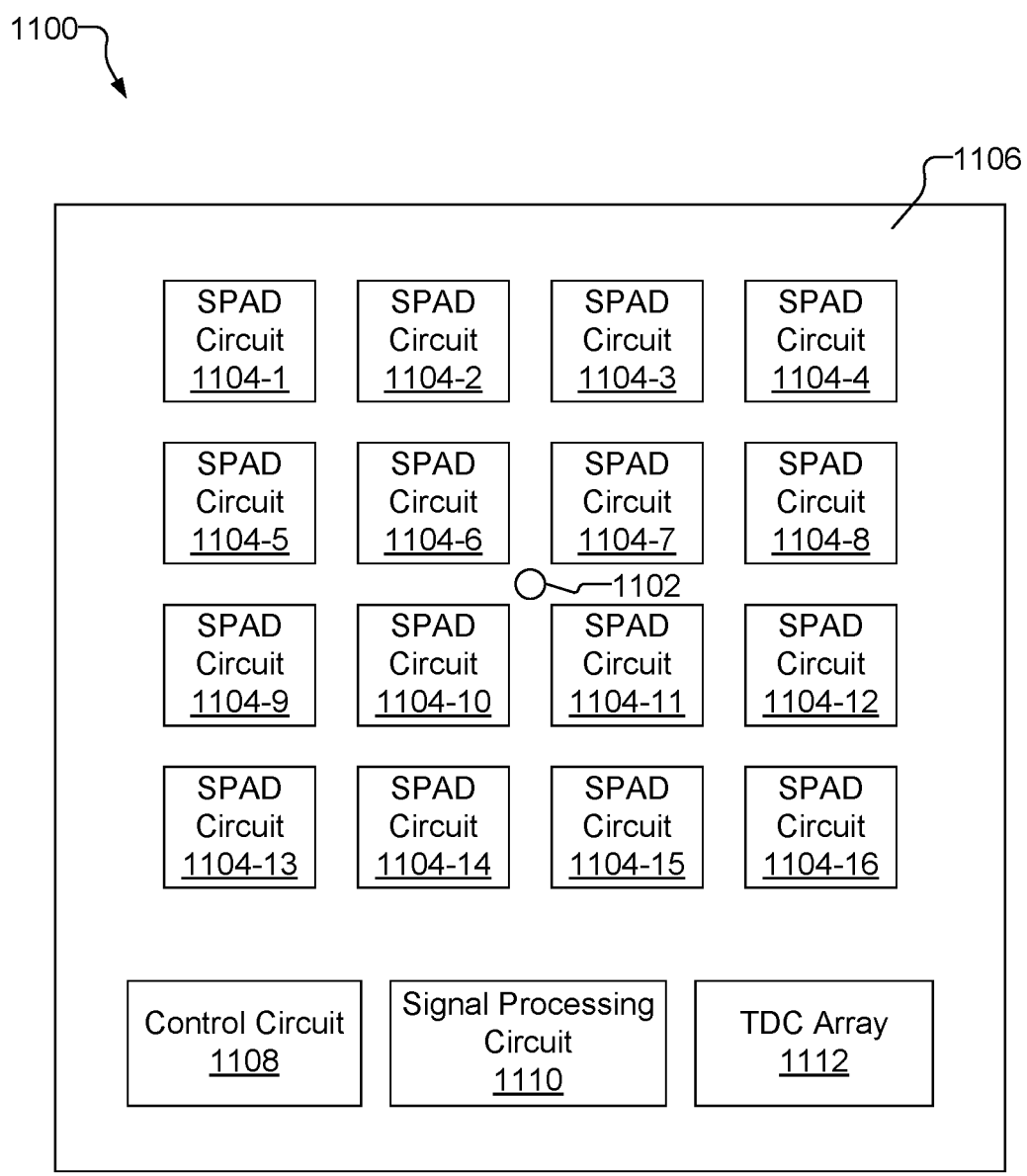
FIG. 11A illustrates an exemplary photodetector system according to principles described herein.

FIG. 11A illustrates an exemplary photodetector system 1100. As shown, photodetector system 1100 includes a light source 1102 and a plurality of SPAD circuits 1104 (i.e., SPAD circuits 1104-1 through 1104-16) disposed on a printed circuit board (PCB) 1106. Alternatively, SPAD circuits 1104 (and the other components of photodetector system 1100) may be disposed on an ASIC. Photodetector system 1100 further includes a control circuit 1108 common to SPADs 1104, a signal processing circuit 1110 common to SPADs 1104, and a TDC array 1112 that includes a plurality of TDCs each corresponding to one of the SPAD circuits 1104. Control circuit 1108, signal processing circuit 1110, and TDC array 1112 may each be disposed on PCB 1106, as shown in FIG. 11A, or located elsewhere within photodetector system 1100. Each SPAD circuit 1104 in combination with a TDC included in TDC array 1112, control circuit 1108, and signal processing circuit 1104 may implement a particular photodetector. Hence, photodetector system 1100 may be said to include an array of photodetectors.

Light source 1102 may be configured to generate one or more light pulses at one or more wavelengths that may be applied to a desired target (e.g., a target within the brain). Light source 1102 may be implemented by any suitable combination of components. For example, light source 1102 may be implemented by a laser source that generates laser pulses. Light source may be implemented on PCB 1106 or external to PCB 1106.

SPAD circuits 1104 are each similar in operation to SPAD circuit 1004 and may be configured to detect photons of a light pulse generated by light source 1102 after the photons reflect or scatter from a target (e.g., a target internal to a user, such as brain tissue). SPAD circuits 1104 may also be used to detect photons reflected from any object due to ambient light for imaging applications. In this case, light source 1102 is not needed since the photons are generated by either ambient light or another light source.

As shown, SPAD circuits 1104 are arranged in a four-by-four array on PCB 1106. The positioning of each SPAD circuit 1104 may correspond, for example, to a pixel within a pixel array. SPAD circuits 1104 may alternatively be arranged in any suitable manner. While sixteen SPAD circuits 1104 are shown in FIG. 11A, it will be recognized that any number of SPAD circuits 1104 may be included in photodetector system 1100.

Control circuit 1108 may be similar in function to control circuit 1006, and may be configured to control each of SPAD circuits 1108. Signal processing circuit 1110 may be similar in function to signal processing circuit 1010, and may be configured to process signals output by each of SPAD circuits 1104. TDC array 1112 may include a plurality of TDCs each similar to TDC 1008 and configured to measure a time difference between the occurrence of a light pulse 1102 and output pulses generated by each of SPAD circuits 1104.

Photodetector system 1100 may be implemented by or included in any suitable device. For example, photodetector system 1100 may be included in a non-invasive wearable device that a user may wear to perform one or more diagnostic, imaging, and/or consumer-related operations.

Figure 11B:
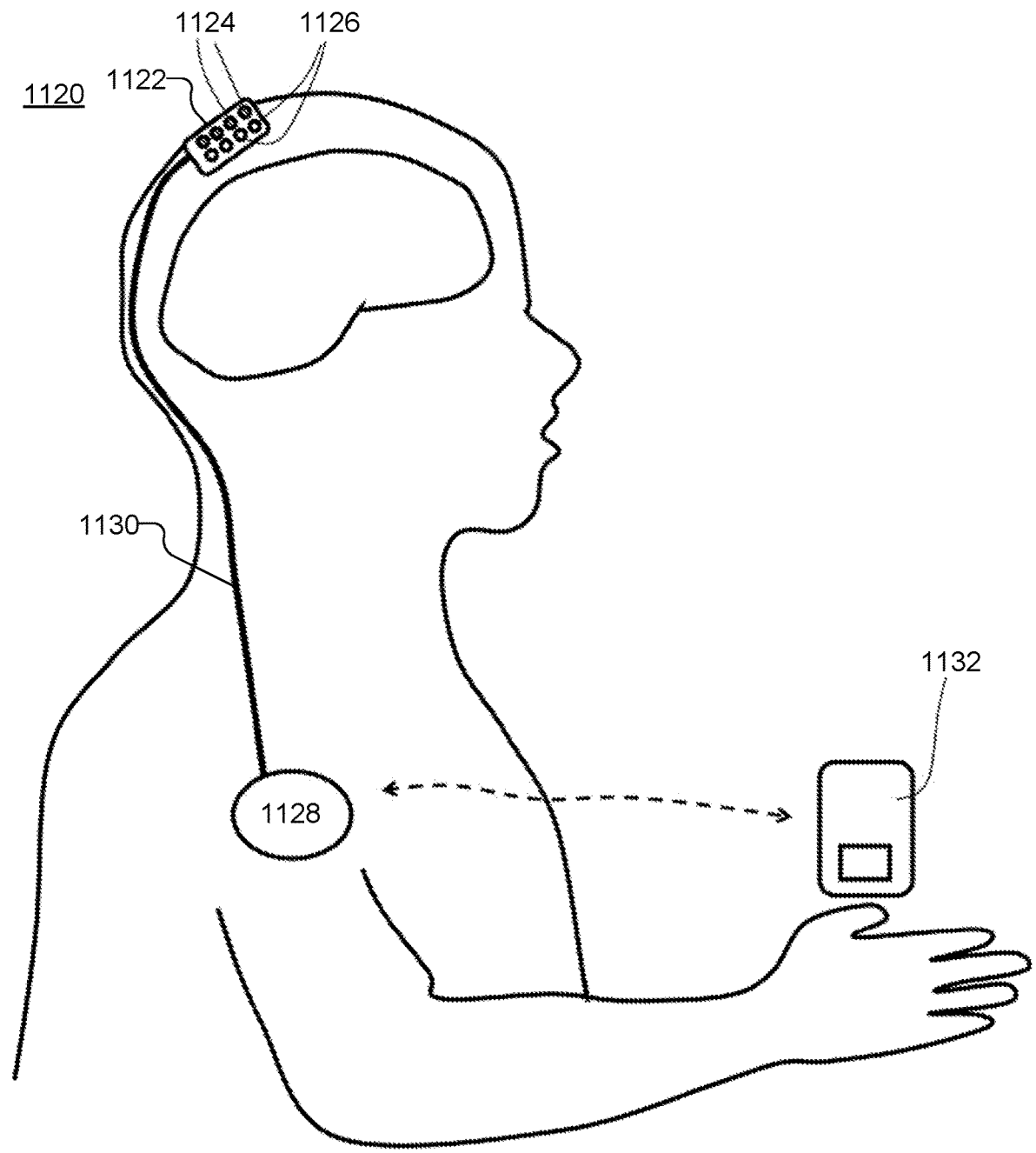
FIG. 11B shows an exemplary non-invasive wearable brain interface system that implements photodetector system according to principles described herein.

To illustrate, FIG. 11B shows an exemplary non-invasive wearable brain interface system 1120 ("brain interface system 1120") that implements a photodetector system, which may be similar to photodetector system 1100. As shown, brain interface system 1120 includes a head-mountable component 1122 configured to be attached to a patient's head. Head-mountable component 1122 may be implemented by a cap shape that is worn on a head of a user. Alternative implementations of head-mountable component 1122 include helmets, beanies, headbands, other hat shapes, etc. Head-mountable component 1122 may be made out of any suitable cloth, soft polymer, plastic, hard shell, and/or any other suitable material as may serve a particular implementation. The non-invasive wearable headgear embodiments as described in U.S. patent application Ser. No. 16/202,771, filed on Nov. 28, 2018, are also incorporated herein by reference.

Head-mountable component 1122 includes a plurality of photodetectors 1124 and a plurality of light sources 1126 configured to generate light pulses. It will be recognized that in some alternative embodiments, head-mountable component 1122 may include a single photodetector 1124 and/or a single light source 1126. For example, brain interface system 1120 may be used for controlling an optical path and for transforming photodetector pixel measurements into an intensity value that represents an optical property of a brain tissue region. Brain interface system 1120 allows optical detection of deep anatomical location through skin and bone by extracting data from photons originating from light source 1126 to the target location, in contrast to traditional imaging systems and methods (e.g., optical coherence tomography (OCT)), which only image superficial tissue structures or through optically transparent structures.

Brain interface system 1120 may further include a processor 1128 configured to communicate with (e.g., control and/or receive signals from) photodetectors 1124 and light sources 1126 by way of a communication link 1130. Communication link 1130 may include any suitable wired and/or wireless communication link. Processor 1128 may include any suitable housing and may be located on the patient's scalp, neck, shoulders, chest, or arm, as may be desirable. In some variations, processor 1128 may be integrated in the same assembly housing as photodetectors 1124 and light sources 1126.

As shown, brain interface system 1120 may optionally include a remote processor 1132 in communication with processor 1128. For example, remote processor 1132 may store measured data from photodetectors 1124 and/or processor 1128 from previous detection sessions and/or from multiple brain interface systems (not shown). Power for photodetectors 1124, light sources 1126, and/or processor 1128 may be provided via a wearable battery (not shown). In some examples, processor 1128 and the battery may be enclosed in a single housing, and wires carrying power signals from processor 1128 and the battery may extend to photodetectors 1124 and light sources 1126. Alternatively, power may be provided wirelessly (e.g., by induction).

In some alternative embodiments, head mountable component 1122 does not include individual light sources. Instead, a light source configured to generate the light that is detected by photodetector 1124 may be included elsewhere in brain interface system 1120. For example, a light source may be included in processor 1128 and coupled to photodetector units 1124 through electrical connections.

Each of the light sources described herein may be implemented by any suitable device. For example, a light source as used herein may be, for example, a distributed feedback (DFB) laser, a super luminescent diode (SLD), a light emitting diode (LED), a diode-pumped solid-state (DPSS) laser, a laser diode (LD), a super luminescent light emitting diode (sLED), a vertical-cavity surface-emitting laser (VCSEL), a titanium sapphire laser, a micro light emitting diode (mLED), and/or any other suitable laser or light source.

Photodetector system 1100 shown in FIG. 11A may alternatively be included in a non-wearable device (e.g., a medical device and/or consumer device that is placed near the head or other body part of a user to perform one or more diagnostic, imaging, and/or consumer-related operations). Photodetector system 1100 may alternatively be included in a sub-assembly enclosure of a wearable invasive device (e.g., an implantable medical device for brain recording and imaging).

Various SPAD circuits that may be used in the photodetector architectures described herein will now be described. Some of the SPAD circuits described herein are gated with a capacitor (or, in some cases, with a parasitic capacitance of the SPAD itself) that is pre-charged with a bias voltage before a command is provided to arm the SPAD.

A SPAD architecture that includes a SPAD that is gated with a capacitor may consume less current (and therefore power) than a conventional SPAD architecture that includes a SPAD that is gated with an active voltage source and allowed to passively quench. This is because the maximum current that the SPAD may consume during an avalanche is limited by the charge stored in the capacitor. By minimizing the power consumption of the SPAD architecture, the SPAD architectures described herein may allow for smaller power supplies to be used to power the SPAD architectures (which is particular advantageous in wearable devices). Moreover, by minimizing power consumption of a SPAD architecture, less stress is placed on the SPAD architecture over time, which may lead to increased longevity components within the SPAD architecture.

A SPAD that is gated with a capacitor also obviates the problem of supply voltage ripple that is associated with SPADs that are gated with active voltage sources. This is because the SPADs in the SPAD architectures described herein are decoupled from all active voltage sources. Hence, the SPAD architectures described herein are isolated from and do not affect performance of other SPAD architectures that are included in the same photodetector array. This isolation may result in reduced variation and improved detection efficiency and sensitivity.

Figure 12A:
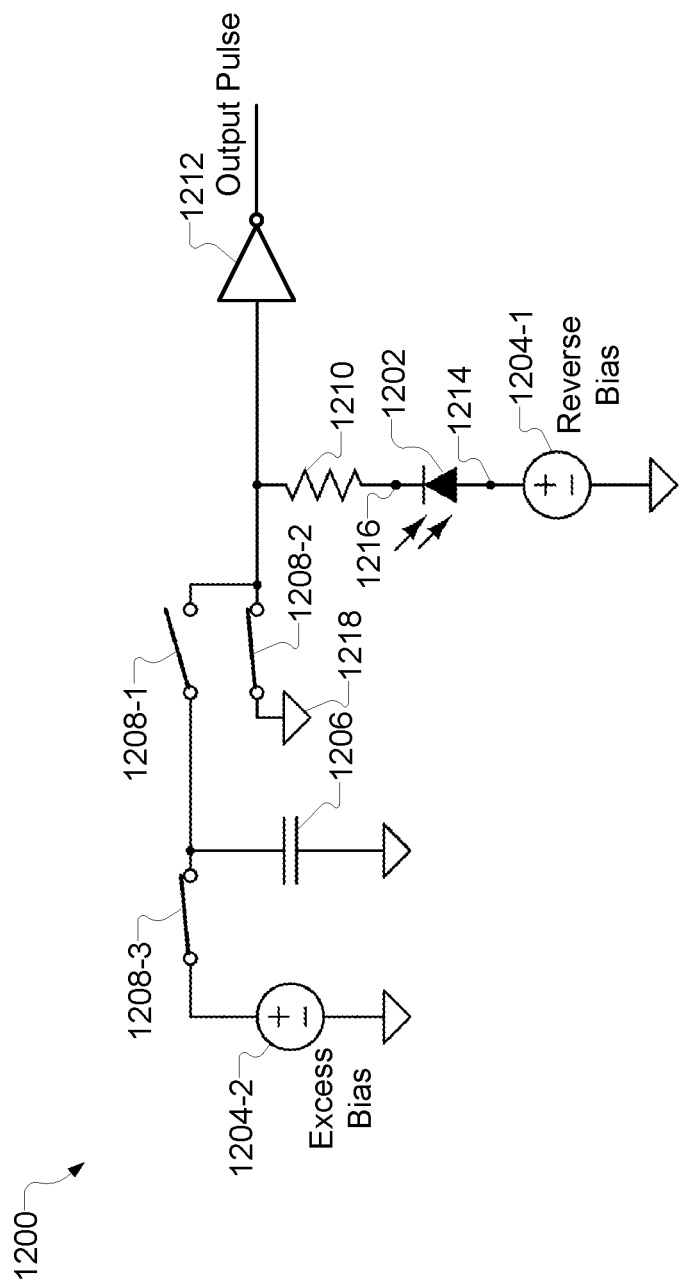
FIG. 12A shows an exemplary SPAD circuit that may be used in the photodetector architectures described herein.

FIG. 12A shows an exemplary SPAD circuit 1200 that may be used in the photodetector architectures described herein. As shown, SPAD circuit 1200 includes a SPAD 1202, voltage sources 1204-1 and 1204-2, a capacitor 1206, a plurality of switches 1208 (i.e., switches 1208-1, 1208-2, and 1208-3), a resistor 1210, and an inverter 1212. The components shown in FIG. 12A other than SPAD 1202 may be included in any of the fast gating circuits described herein.

As shown, voltage source 1204-1 is connected to an input node 1214 (also referred to as an anode) of SPAD 1202. Voltage source 1204-1 may include any suitable active voltage source configured to supply a reverse bias voltage at input node 1214. The reverse bias voltage has a magnitude that is equal to or less than a breakdown voltage of SPAD 1202. In some examples, the reverse bias voltage supplied by voltage source 1204-1 has a magnitude that is less than the breakdown voltage of SPAD 1202 by a predetermined amount. For example, the reverse bias voltage supplied by voltage source 1204-1 may be within 1-2 volts of the breakdown voltage of SPAD 1202. An exemplary breakdown voltage of SPAD 1202 is 20 volts. Hence, an exemplary, but not exclusive, magnitude of the reverse bias voltage supplied by voltage source 1204-1 is 18-19 volts.

Voltage source 1204-2 may include any suitable active voltage source and is configured to be selectively connected to capacitor 1206 by way of switch 1208-3. For example, voltage source 1204-2 is connected to capacitor 1206 when switch 1208-3 is closed and disconnected from capacitor 1206 when switch 1208-3 is open. When voltage source 1204-2 is connected to capacitor 1206, voltage source 1204-2 charges capacitor 1206 with an excess bias voltage. In some examples, the excess bias voltage has a magnitude that is less than or equal to the breakdown voltage of SPAD 1202 (e.g., less than the magnitude of the reverse bias voltage supplied by voltage source 1204-1). For example, the excess bias voltage may be 2-5 volts. However, the excess bias voltage may have any other suitable value as may serve a particular implementation.

In some examples, the excess bias voltage may be set to a value that compensates for the parasitic capacitance of SPAD 1202. It will be recognized that when capacitor 1206 is connected to SPAD 1202, some of the charge on capacitor 1206 will be transferred to the parasitic capacitance of SPAD 1202. Hence, the excess bias voltage may be set to ensure that the total voltage across SPAD 1202 exceeds the breakdown voltage of SPAD 1202 even after the parasitic capacitance of SPAD 1202 is charged.

Switches 1208 (also referred to herein as a "switch configuration") are configured to selectively arm and disarm SPAD 1202. For example, as will be illustrated below, switches 1208-1 and 1208-2 may put SPAD 1202 into an armed state by connecting capacitor 1206 to an output node 1216 (also referred to as a cathode) of SPAD 1202 while capacitor 1206 is charged with the excess bias voltage and while capacitor 1206 is disconnected from voltage source 1204-2. As shown, capacitor 1206 may be connected to output node 1216 by way of resistor 1210. In some alternative embodiments, resistor 1210 is connected between SPAD 1202 and voltage source 1204-1. In yet other alternative embodiments, resistor 1210 is not included in SPAD circuit 1200, and capacitor 1206 may be connected directly to output node 1216.

When capacitor 1206 is connected to output node 1216, capacitor 1206 supplies the excess bias voltage to output node 1216. This causes the voltage across SPAD 1202 to be greater than the breakdown voltage of SPAD 1202, thereby putting SPAD 1202 in the armed state. For example, if the breakdown voltage of SPAD 1202 is 20 volts, the reverse bias voltage as supplied by voltage source 1204-1 at input node 1214 is −18 volts, and the excess bias voltage supplied by capacitor 1206 at output node 1216 is 3 volts when capacitor 1206 is fully charged, the voltage across SPAD 1202 is 21 volts when capacitor 1206, which is greater than the breakdown voltage of SPAD 1202.

Capacitor 1206 may be of any suitable size (i.e., capacity). In some examples, the size of capacitor 1206 may be relatively small in order to reduce the current flow through SPAD 1202 during an avalanche. This minimizes power consumption, quench time, afterpulsing, and time jitter.

Switches 1208-1 and 1208-2 may put SPAD 1202 into a disarmed state by disconnecting capacitor 1206 from output node 1216 of SPAD 1202 and connecting the output node of SPAD 1202 to ground 1218. In this configuration, the voltage across SPAD 1202 is substantially equal to the magnitude of the reverse bias voltage, which is less than the breakdown voltage of SPAD 1202.

Inverter 1212 is configured to generate an output pulse when a photon hits SPAD 1202 while SPAD 1202 is in the armed state. When a photon initiates an avalanche within SPAD 1202, SPAD 1202 draws current from capacitor 1206, which discharges capacitor 1206 to zero. As capacitor 1206 is discharged, the voltage at output node 1216 decreases. When the voltage at output node 1216 drops below a certain value, inverter 1212 generates an output pulse. In some examples, a power supply to inverter 1212 is adjustable to account for different thresholds.

Figure 12B:
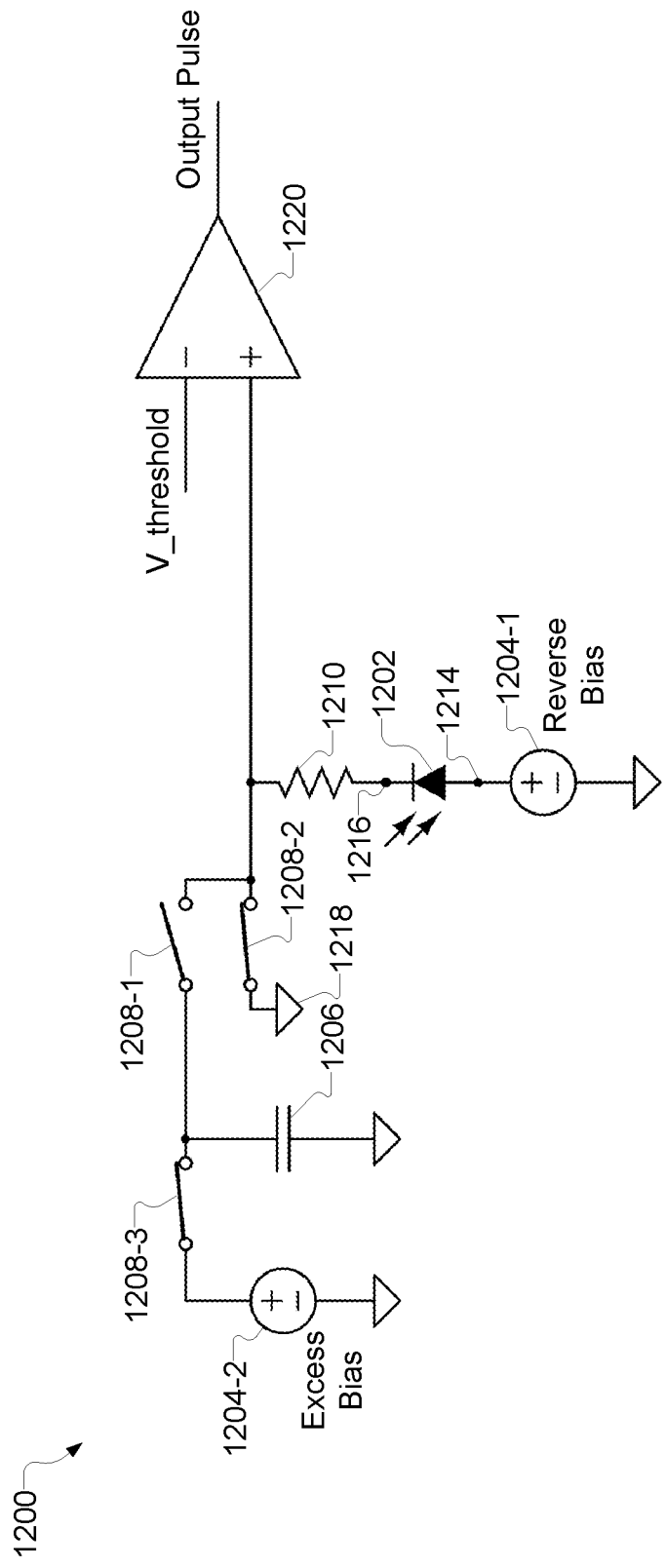
FIG. 12B shows another exemplary SPAD circuit that may be used in the photodetector architectures described herein.

FIG. 12B shows an alternative implementation of SPAD circuit 1200 in which a comparator 1220 is included in SPAD circuit 1200 in place of inverter 1212. Comparator 1220 is configured to generate an output pulse when a photon hits SPAD 1202 while SPAD 1202 is in the armed state. To this end, comparator 1220 has a negative terminal and a positive terminal. A threshold voltage (V_threshold) is on the negative terminal. This threshold voltage is less than voltage across SPAD 1202 while SPAD 1202 is in the armed state and capacitor 1206 is fully charged with the excess bias voltage. The positive terminal of comparator 1220 is connected to output node 1216 (e.g., by way of resistor 1210). When a photon initiates an avalanche within SPAD 1202, SPAD 1202 draws current from capacitor 1206, which discharges capacitor 1206 to zero. As capacitor 1206 is discharged, the voltage at output node 1216 decreases. When the voltage at output node 1216 drops below the threshold voltage on the negative terminal of comparator 1220, comparator 1220 generates an output pulse.

Figure 13:
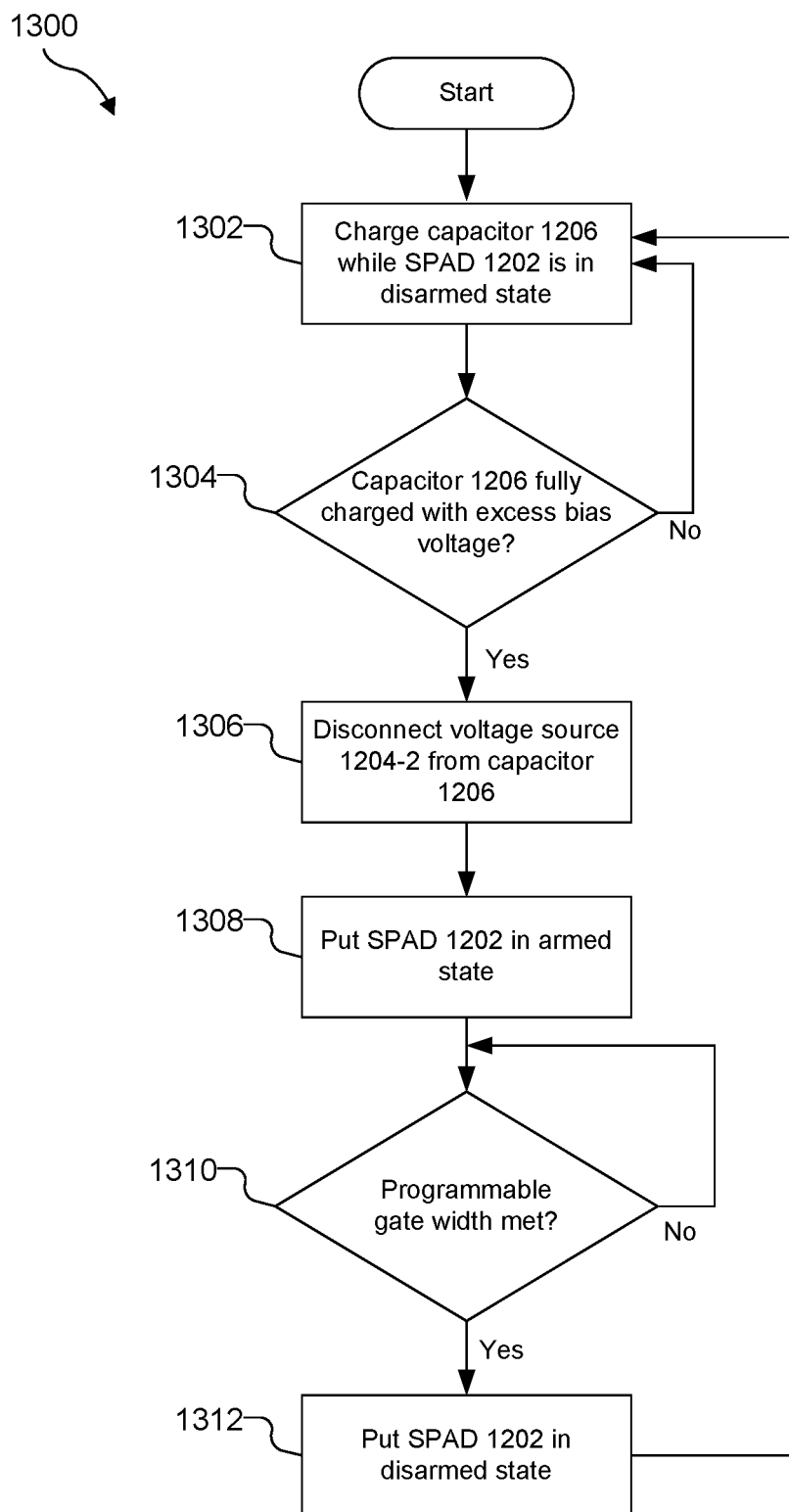
FIG. 13 is a flowchart that illustrates an exemplary mode of operation of the SPAD circuit of FIG. 12A according to principles described herein.

FIG. 13 is a flowchart 1300 that illustrates an exemplary mode of operation of SPAD circuit 1200. For purposes of this example, control circuit 1006 is configured to control SPAD circuit 1200 by controlling switches 1208, TDC 1008 is connected to the output of inverter 1212, and signal processing circuit 1010 is connected to the output of TDC 1008. One or more of the operations shown in flowchart 1300 may be performed by control circuit 1006.

In operation 1302, capacitor 1206 is charged with the excess bias voltage while SPAD 1202 is in a disarmed state. Control circuit 1006 may cause capacitor 1206 to be charged with the excess bias voltage while SPAD 1202 is in the disarmed state by providing control logic that opens switch 1208-1 to disconnect output node 1216 of SPAD 1202 from capacitor 1206, closes switch 1208-2 to connect output node 1216 of SPAD 1202 to ground 1218, and closes switch 1208-3 to connect voltage source 1204-2 to capacitor 1206. This switch state is shown in FIG. 12A.

Figure 14:
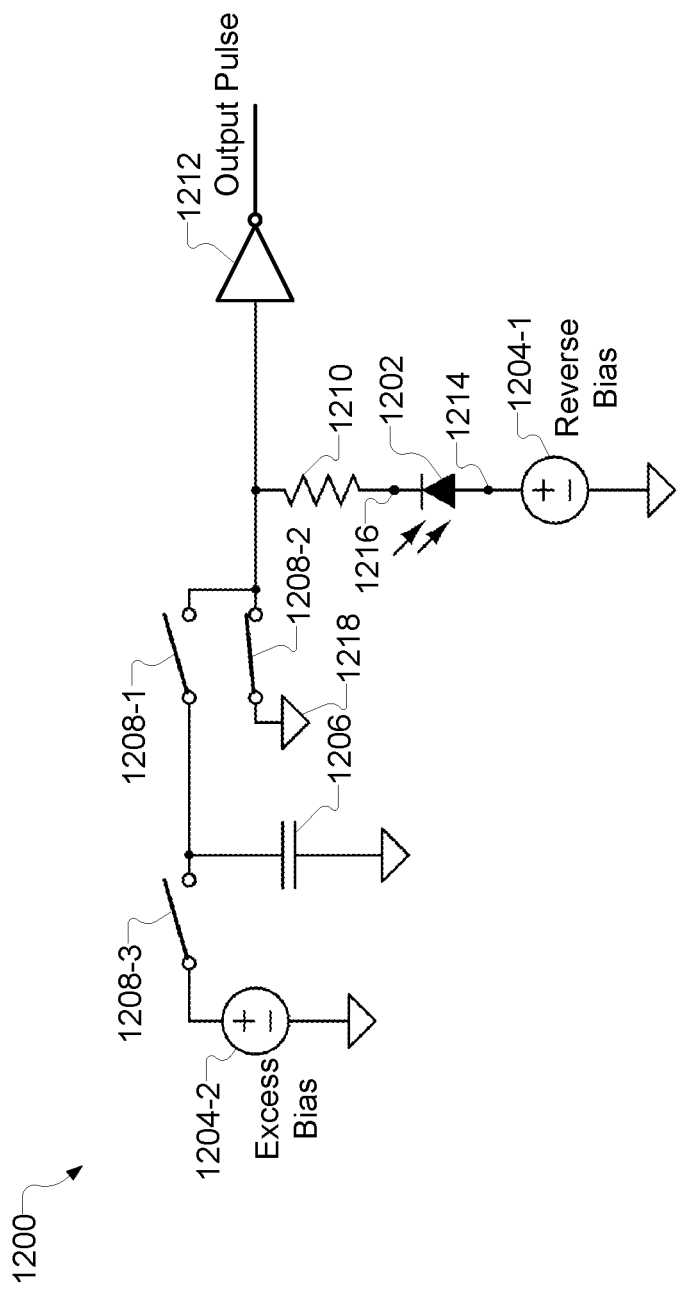
FIGS. 14-15 show exemplary switch states of the SPAD circuit of FIG. 12A.

While in the switch state shown in FIG. 12A, voltage source 1204-2 charges capacitor 1206 with the excess bias voltage. When control circuit 1006 detects that capacitor 1206 is fully charged with the excess bias voltage (Yes; decision block 1304), control circuit 1006 disconnects voltage source 1204-2 from capacitor 1206 (operation 1306). This is performed by control circuit 1006 providing control logic that opens switch 1208-3 while switch 1208-1 is still open and switch 1208-2 is still closed. This switch state is shown in FIG. 14.

Figure 15:
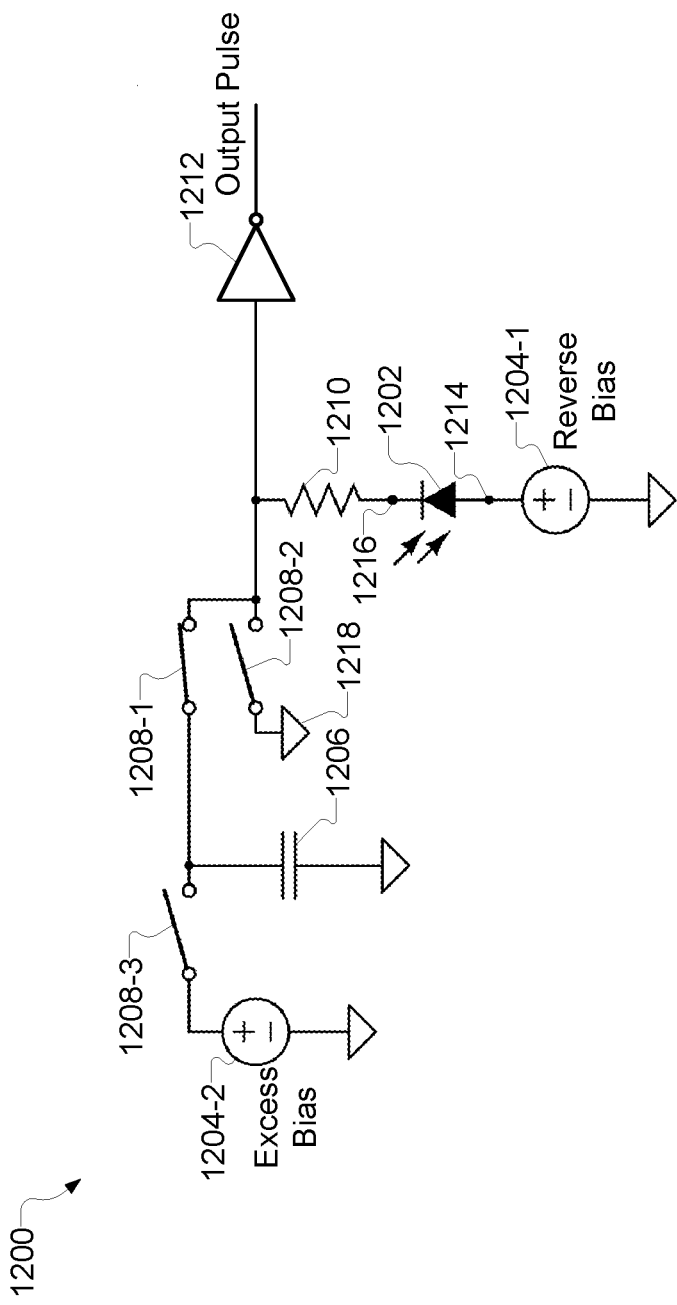

In operation 1308, control circuit 1006 puts SPAD 1202 in an armed state once capacitor 1206 is charged with the excess bias voltage. To this end, control circuit 1006 provides control logic that closes switch 1208-1 to connect output node 1216 of SPAD 1202 to capacitor 1206, opens switch 1208-2 to disconnect output node 1216 of SPAD 1202 from ground 1218, and keeps switch 1208-3 open to keep the voltage source 1204-2 disconnected from capacitor 1206. This switch state is shown in FIG. 15. While in the switch state shown in FIG. 15, SPAD 1202 is armed because the voltage across SPAD 1202 is higher than the breakdown voltage of SPAD 1202.

In some examples, control circuit 1006 waits to put SPAD 1202 in the armed state until a predetermined amount of time elapses after an occurrence of a light pulse (e.g., a light pulse generated by light source 1102). In this manner, SPAD circuit 1202 may be configured to detect a photon arriving from a particular depth within a user (e.g., a particular depth within the brain of the user).

For example, control circuit 1006 may maintain data representative of a programmable gate delay. The programmable gate delay specifies a predetermined amount of time that control circuit 1006 is to wait after an occurrence of a light pulse to put SPAD 1202 in the armed state. The programmable gate delay may be programmed by a user (e.g., via a software and/or hardware interface with control circuit 1006) to specify any suitable amount of time. Additionally or alternatively, the programmable gate delay may be determined by signal processing circuit 1010.

Control circuit 1006 may use the programmable gate delay by detecting an occurrence of a light pulse (e.g., by receiving light pulse timing information that specifies a time that the light pulse is generated) while SPAD 1202 is in the disarmed state and putting SPAD 1202 in the armed state a predetermined amount of time, as specified by the programmable gate delay, after the occurrence of the light pulse. Control circuit 1006 may alternatively set SPAD 1202 to always be armed by closing switches 1208-1 and 1208-3 while keeping switch 1208-2 open.

Figure 16:
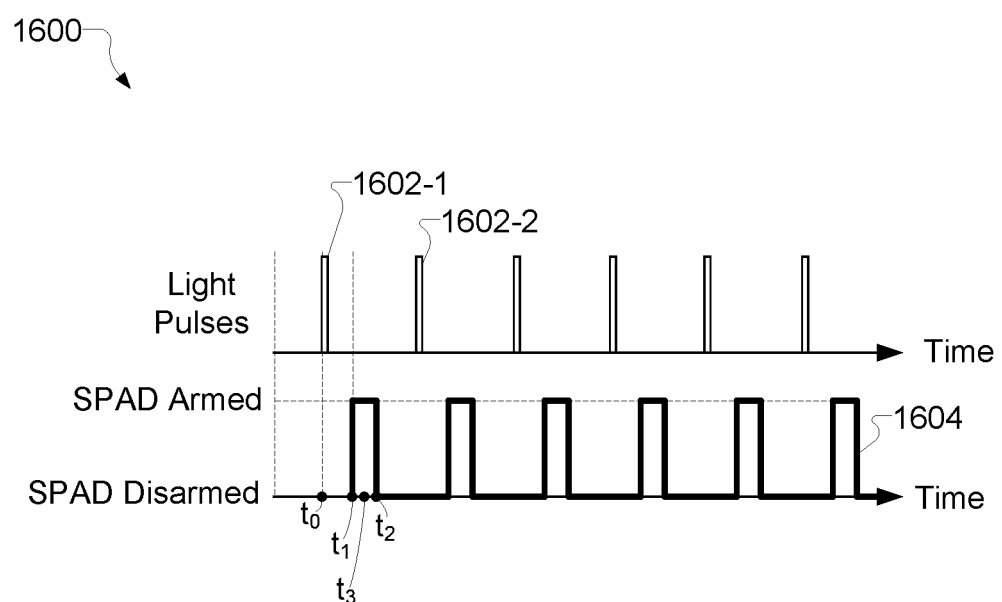
FIG. 16 shows an exemplary timing diagram that illustrates a relationship between the occurrence of a light pulse and a programmable gate delay according to principles described herein.

FIG. 16 shows an exemplary timing diagram 1600 that illustrates a relationship between the occurrence of a light pulse and the programmable gate delay used by control circuit 1006. As shown, a sequence of light pulses 1602 (e.g., light pulses 1602-1 and 1602-2) may be applied to a target (e.g., tissue within the brain of a user). An exemplary frequency at which light pulses 1602 are applied is 40-100 megahertz.

During the application of the sequence of light pulses 1602, SPAD 1202 is armed and disarmed in accordance with one or more timing parameters (e.g., a programmable gate delay, a programmable gate width, etc.) maintained by control circuit 1206. This arming and disarming is represented by pulse wave 1604. As shown, when pulse wave 1604 is high, SPAD 1202 is in the armed state. When pulse wave 1604 is low, SPAD 1202 is in the disarmed state.

As shown, each light pulse 1602 occurs (i.e., is applied) while SPAD 1202 is in the disarmed state. Each light pulse 1602 occurs at a particular time. For example, light pulse 1602-1 occurs at time $t_0$. The programmable gate delay maintained by control circuit 1006 specifies how long control circuit 1006 waits until outputting control data that puts SPAD 1202 in the armed state. In the example of FIG. 16, SPAD 1202 is put into the armed state at time $t_1$. Hence, the programmable gate delay is equal to $t_1 - t_0$. An exemplary programmable gate delay is between zero picoseconds and 4 nanoseconds. As mentioned above, the rise time associated with SPAD 1202 going from the disarmed state to the armed state is relatively fast (e.g., almost instantaneous) because SPAD 1202 is being gated by capacitor 1206 instead of by an active voltage source.

In some examples, control circuit 1006 also maintains data representative of a programmable gate width, which specifies how long SPAD 1202 is kept in the armed state before being disarmed. The programmable gate width may be programmed by a user (e.g., via a software and/or hardware interface with control circuit 1006) to specify any suitable amount of time. Additionally or alternatively, the programmable gate width may be derived in signal processing circuit 1010.

In the timing diagram of FIG. 16, SPAD 1202 is disarmed at time $t_2$. Hence, the programmable gate width in this example is equal to $t_2 - t_1$. By controlling the gate width, control circuit 1006 may ensure that SPAD 1202 is disarmed for a relatively long time before the occurrence of a subsequent light pulse. This may advantageously avoid afterpulsing, which may distort data acquired by the photodetector by triggering an output pulse by inverter 1212 that is not indicative of an arrival of an actual photon.

Accordingly, if control circuit 1006 detects that the programmable gate width is met (i.e., that the predetermined time specified by the programmable gate width has expired) (Yes; decision block 1310), control circuit 1006 puts SPAD 1202 back in the disarmed state (operation 1312) by opening switch 1208-1 to disconnect output node 1216 of SPAD 1202 from capacitor 1206 and closing switch 1208-2 to connect output node 1216 of SPAD 1202 to ground 1218. The process shown in FIG. 13 may be repeated for subsequent light pulses. For example, while SPAD 1202 is in the disarmed state, capacitor 1206 may again be charged so that SPAD 1202 may again be armed and detect a photon from light pulse 1602-2.

Once SPAD 1202 has been put in the armed state, a photon from the light pulse may initiate an avalanche within SPAD 1202. As described above, SPAD 1202 draws current from capacitor 1206 while the avalanche is occurring, which decreases the voltage at output node 1216. When the voltage at output node 1216 drops below a certain value, inverter 1212 generates an output pulse.

TDC 1008 may measure a time difference between an occurrence of the output pulse generated by inverter 1212 and an occurrence of light pulse 1602-1 in any suitable manner. For example, referring to FIG. 16, inverter 1212 may generate an output pulse at time $t_3$. TDC 1008 may measure a time difference between the occurrence of the output pulse and the occurrence of light pulse 1602-1 by computing a difference between $t_3$ and $t_0$. Alternatively, TDC 1008 may compute a difference between $t_3$ and an occurrence of a subsequent light pulse (i.e., light pulse 1602-2) and thereby determine the time difference between the occurrence of the output pulse and the occurrence of light pulse 1602-1.

TDC 1008 may output data representative of the time difference between the occurrence of the output pulse and the occurrence of light pulse 1602-1 to signal processing circuit 1010. Signal processing circuit 1010 may perform one or more of the signal processing operations described herein on the data.

Figure 17A:
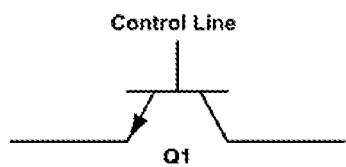
FIGS. 17A-17F show various circuits that may implement any of the switches described herein.
Figure 17B:
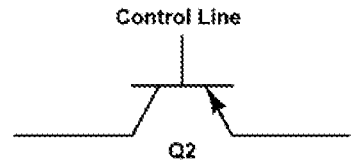
Figure 17C:
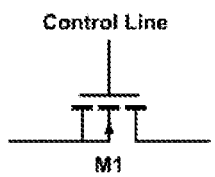
Figure 17D:
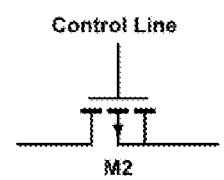
Figure 17E:
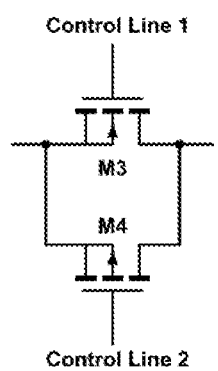
Figure 17F:
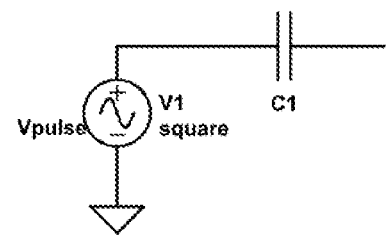

The various components included in SPAD circuit 1200 may be implemented in any suitable manner. For example, switches 1208 may each be implemented by any suitable switch circuitry. To illustrate, FIGS. 17A-17F show various circuits that may implement any of switches 1208. In particular, FIG. 17A shows an NPN bipolar junction transistor that may implement one or more of switches 1208, FIG. 17B shows PNP bipolar junction transistor that may implement one or more of switches 1208, FIG. 17C shows an NMOS MOSFET that may implement one or more of switches 1208, FIG. 17D shows a PMOS MOSFET that may implement one or more of switches 1208, FIG. 17E shows a transmission gate that may implement one or more of switches 1208, and FIG. 17F shows a square wave generator and a capacitor that may implement one or more of switches 1208.

Figure 18A:
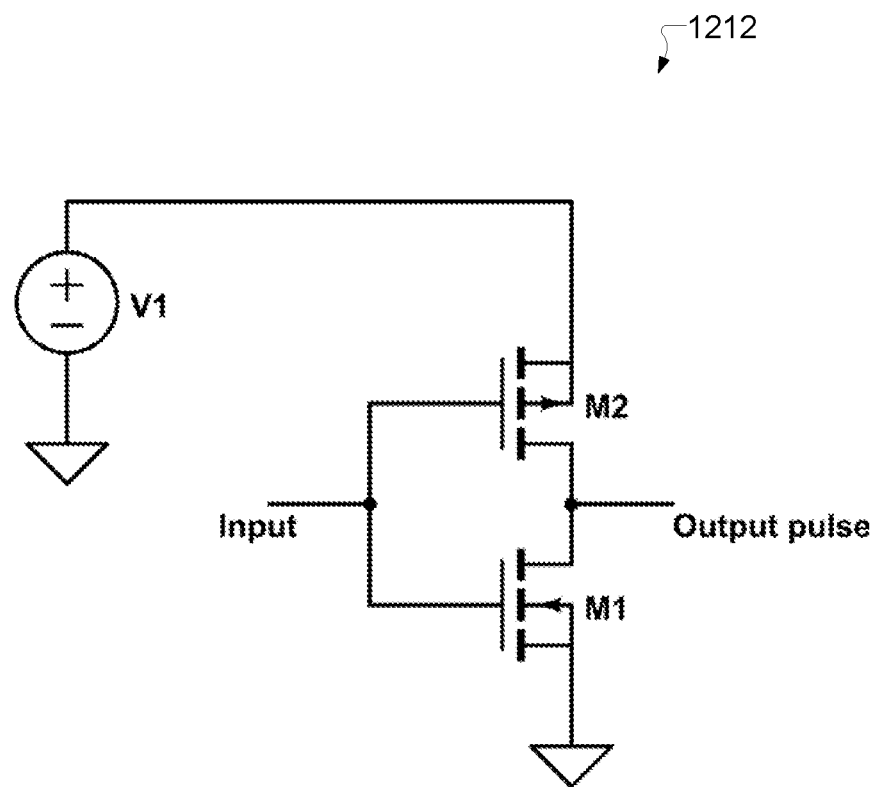
FIG. 18A illustrates an exemplary implementation of an inverter according to principles described herein.

FIG. 18A illustrates an exemplary implementation of inverter 1212, shown in FIG. 12A. In this implementation, when an avalanche happens, the voltage on output node 1216 of SPAD 1202 drops close to zero, causing the output pulse generated by inverter 1212 to go high. Various other circuit topologies may implement inverter 1212 as may serve a particular implementation.

Figure 18B:
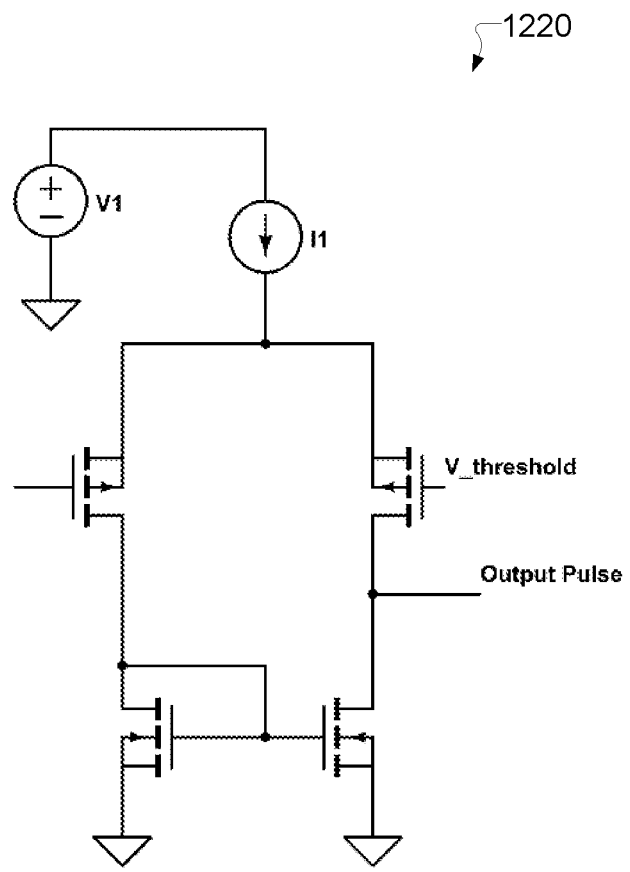
FIG. 18B illustrates an exemplary implementation of a comparator according to principles described herein.

FIG. 18B illustrates an exemplary implementation of comparator 1220, shown in FIG. 12B. In this implementation, when an avalanche happens, the voltage on output node 1216 of SPAD 1202 drops close to zero, causing the output pulse generated by comparator 1220 to go high. Various other circuit topologies may implement comparator 1220 as may serve a particular implementation.

In some examples, inverter 1212 and comparator 1220 may be omitted from SPAD circuit 1200. In these examples, the output from SPAD 1202 is provided as the input to TDC 1008.

Figure 19A:
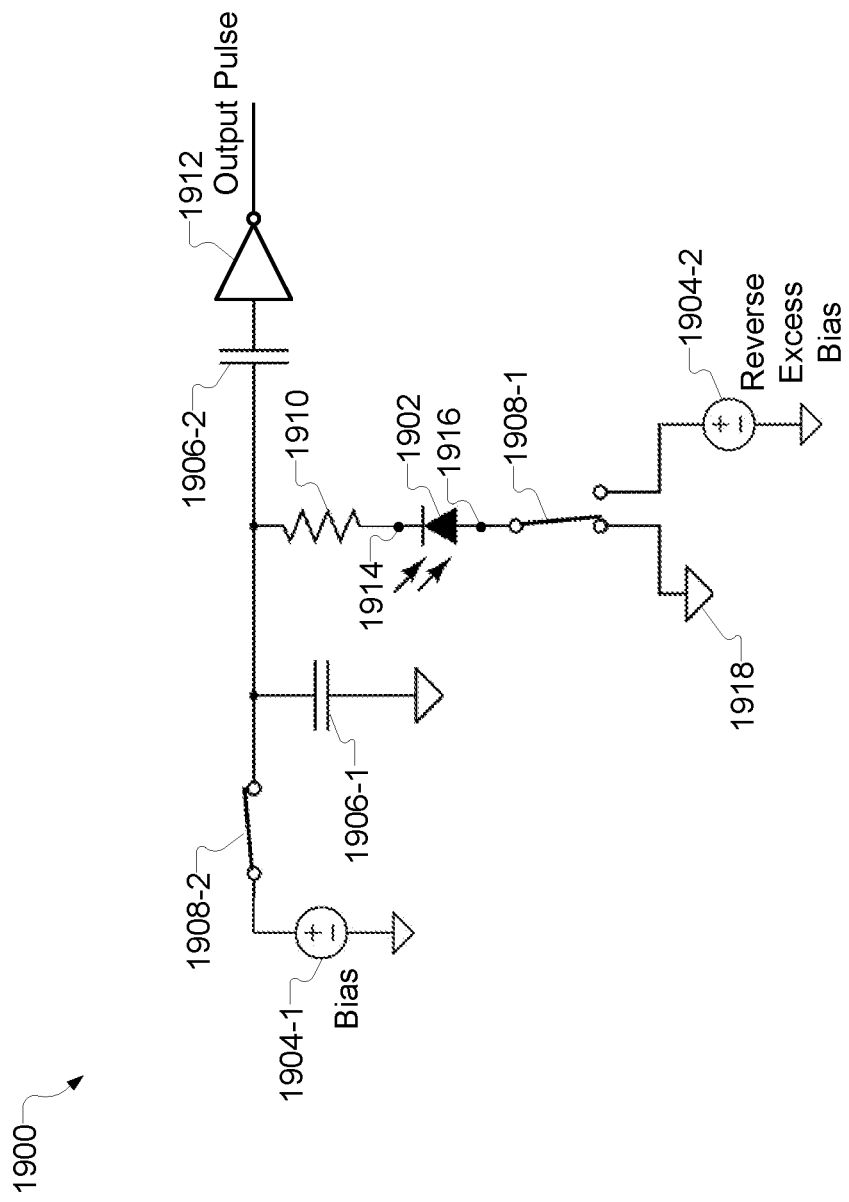
FIG. 19A shows another exemplary SPAD circuit that may be used in the photodetector architectures described herein.

FIG. 19A shows another exemplary SPAD circuit 1900 that may be used in the photodetector architectures described herein. As shown, SPAD circuit 1900 includes a SPAD 1902, voltage sources 1904-1 and 1904-2, capacitors 1906-1 and 1906-2, a plurality of switches 1908 (i.e., switches 1908-1 and 1908-2), a resistor 1910, and an inverter 1912.

As shown, capacitor 1906-1 is connected to an output node 1914 of SPAD 1902. Capacitor 1906-1 may have any suitable size as may serve a particular implementation. Capacitor 1906-1 is shown to be connected to output node 1914 by way of resistor 1910. In some examples, resistor 1910 is not actually a physical resistor, but represents the internal resistance of SPAD 1902.

Voltage source 1904-1 may include any suitable active voltage source and is configured to be selectively connected to capacitor 1906-1 by way of switch 1908-2. For example, voltage source 1904-1 is connected to capacitor 1906-1 when switch 1908-1 is in a first position and disconnected from capacitor 1906-1 when switch 1908-1 is in a second position. In the examples provided herein, switch 1908-1 is closed while in the first position and open while in the second position. It will be recognized that in alternative configurations, voltage source 1904-1 may be connected to capacitor 1906-1 when switch 1908-1 is open and disconnected from capacitor 1906-1 when switch 1908-1 is closed.

When voltage source 1904-1 is connected to capacitor 1906-1, voltage source 1904-1 charges capacitor 1906-1 with a bias voltage. The bias voltage has a magnitude that equal to or less than a breakdown voltage of SPAD 1902. In some examples, the bias voltage supplied by voltage source 1904-1 has a magnitude that is less than the breakdown voltage of SPAD 1902 by a predetermined amount. For example, the bias voltage supplied by voltage source 1904-1 may be within 1-2 volts of the breakdown voltage of SPAD 1902. An exemplary breakdown voltage of SPAD 1902 is 20 volts. Hence, an exemplary, but not exclusive, magnitude of the bias voltage supplied by voltage source 1904-1 is 18-19 volts.

As shown, voltage source 1904-2 is connected to an input node 1916 of SPAD 1902. Voltage source 1904-2 may include any suitable active voltage source configured to supply a reverse excess bias voltage at input node 1916. In some examples, the reverse excess bias voltage has a magnitude that is less than or equal to the breakdown voltage of SPAD 1902 (e.g., less than or equal to the magnitude of the bias voltage supplied by voltage source 1904-1). For example, the reverse excess bias voltage may be negative 2-5 volts. However, the reverse excess bias voltage may have any other suitable value as may serve a particular implementation. As described above, the reverse excess bias voltage may be set to a value that compensates for the parasitic capacitance of SPAD 1902.

Switches 1908 are configured to selectively arm and disarm SPAD 1902. For example, as will be illustrated below, switch 1908-1 may put SPAD 1902 into an armed state by connecting voltage source 1904-2 to input node 1916 of SPAD 1902 while capacitor 1906-1 is both charged with the bias voltage and disconnected from voltage source 1904-1.

When voltage source 1904-2 is connected to input node 1916, voltage source 1904-2 supplies the reverse excess bias voltage to input node 1916. This causes the voltage across SPAD 1902 to be greater than the breakdown voltage of SPAD 1902, thereby putting SPAD 1902 in the armed state. For example, if the breakdown voltage of SPAD 1902 is 20 volts, the bias voltage as supplied by capacitor 1906-1 at output node 1914 is 18 volts when capacitor 1906-1 is fully charged, and the reverse excess bias voltage supplied by voltage source 1904-2 at input node 1916 is −3 volts, the voltage across SPAD 1902 is 21 volts, which is greater than the breakdown voltage of SPAD 1902.

Switch 1908-1 may put SPAD 1902 into a disarmed state by disconnecting voltage source 1904-2 from input node 1916 of SPAD 1902 and connecting input node 1916 of SPAD 1902 to ground 1918. In this configuration, the voltage across SPAD 1902 is substantially equal to the magnitude of the bias voltage, which is less than the breakdown voltage of SPAD 1902.

Inverter 1912 is similar to inverter 1212 and is configured to generate an output pulse when a photon hits SPAD 1902 while SPAD 1902 is in the armed state. When a photon initiates an avalanche within SPAD 1902, SPAD 1902 draws current from capacitor 1906-1, which discharges capacitor 1906-1 to zero. As capacitor 1906-1 is discharged, the voltage at output node 1914 decreases. When the voltage at output node 1914 drops below a certain value, inverter 1912 generates an output pulse.

Figure 19B:
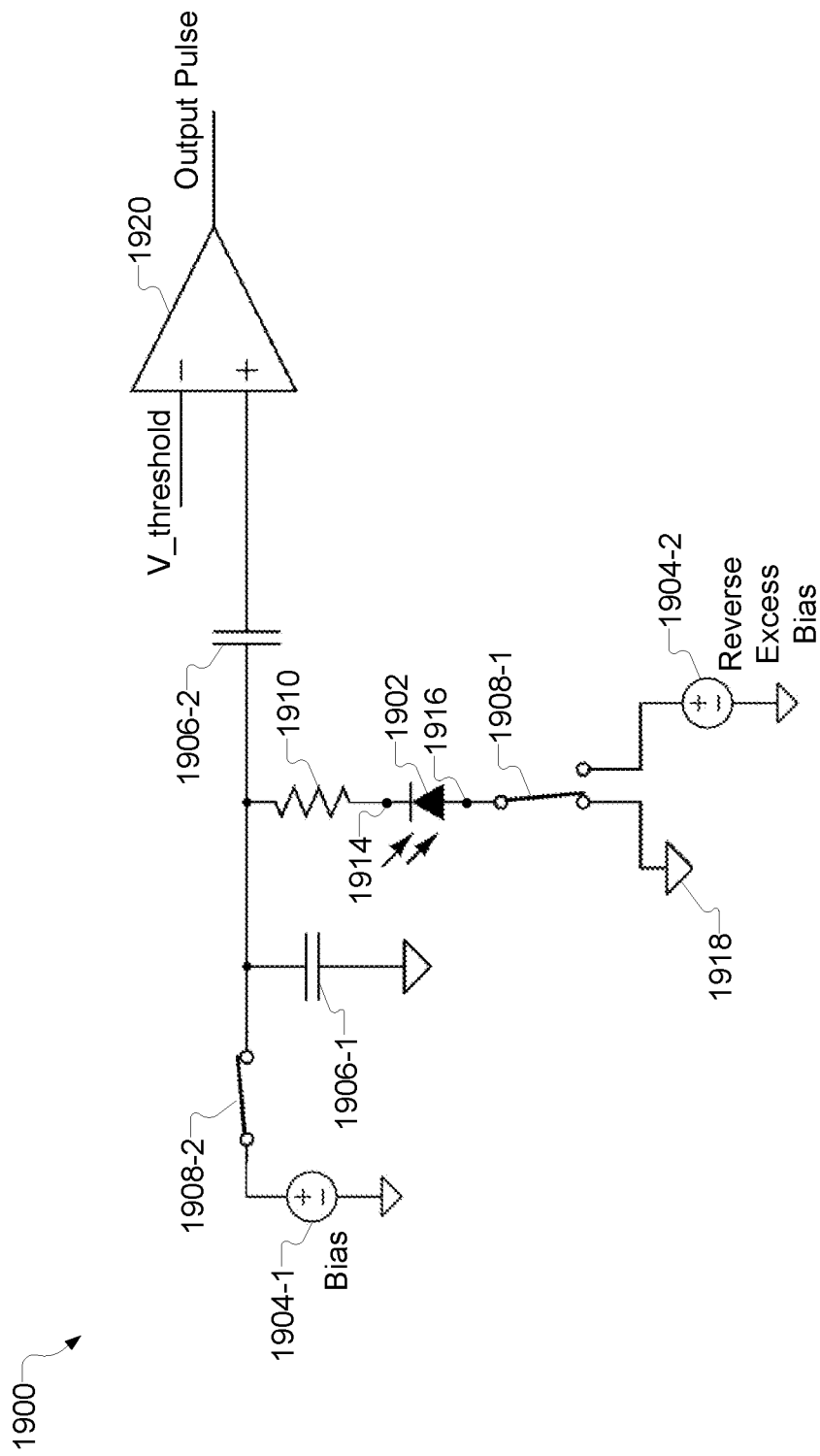
FIG. 19B shows another exemplary SPAD circuit that may be used in the photodetector architectures described herein.

FIG. 19B shows an alternative implementation of SPAD circuit 1900 in which a comparator 1920 is included in SPAD circuit 1200 in place of inverter 1912. Comparator 1920 is similar to comparator 1220 and is configured to generate an output pulse when a photon hits SPAD 1902 while SPAD 1902 is in the armed state. As shown, a positive terminal of comparator 1920 is connected to output node 1914 of SPAD 1902 by way of capacitor 1906-2. In some examples, capacitor 1906-2 is omitted from SPAD circuit 1900.

When a photon initiates an avalanche within SPAD 1902, SPAD 1902 draws current from capacitor 1906-1, which discharges capacitor 1906-1 to zero. As capacitor 1906-1 is discharged, the voltage at output node 1914 decreases. When the voltage at output node 1914 drops below the threshold voltage on the negative terminal of comparator 1920, comparator 1920 generates an output pulse.

Figure 20:
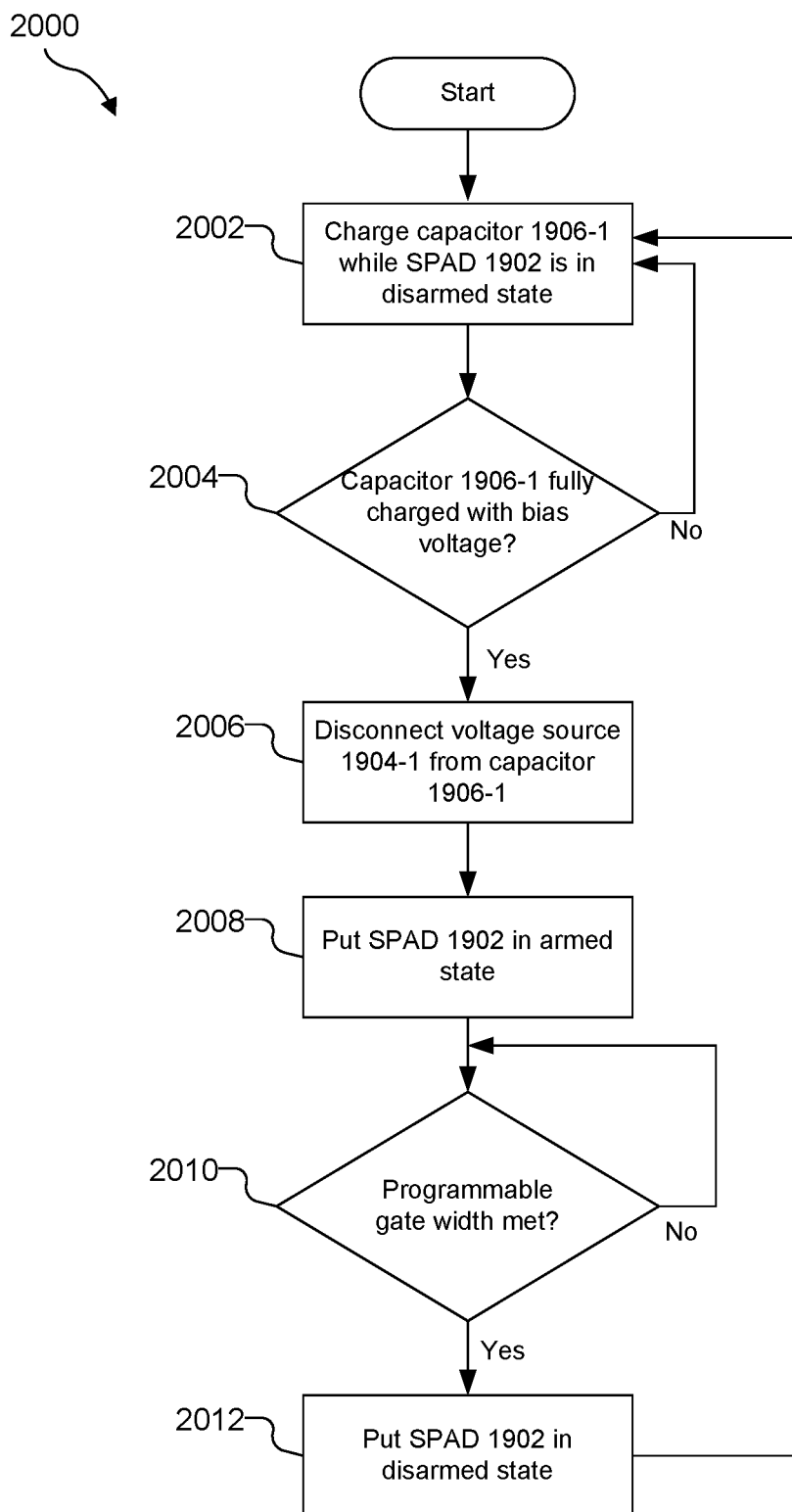
FIG. 20 is a flowchart that illustrates an exemplary mode of operation of the SPAD circuit of FIG. 19A according to principles described herein.

FIG. 20 is a flowchart 2000 that illustrates an exemplary mode of operation of SPAD circuit 1900. For purposes of this example, control circuit 1006 is configured to control SPAD circuit 1900 by controlling switches 1908, TDC 1008 is connected to the output of inverter 1912, and signal processing circuit 1010 is connected to the output of TDC 1008. One or more of the operations shown in flowchart 2000 may be performed by control circuit 1006.

In operation 2002, capacitor 1906-1 is charged with the bias voltage while SPAD 1902 is in a disarmed state. Control circuit 1006 may cause capacitor 1906-1 to be charged with the bias voltage while SPAD 1902 is in the disarmed state by providing control logic that causes switch 1908-1 to be in a first position (i.e., closed) to connect input node 1916 of SPAD 1902 to ground 1918 and switch 1908-2 to be in the first position to connect voltage source 1904-1 to capacitor 1906-1. This switch state is shown in FIG. 19A.

Figure 21:
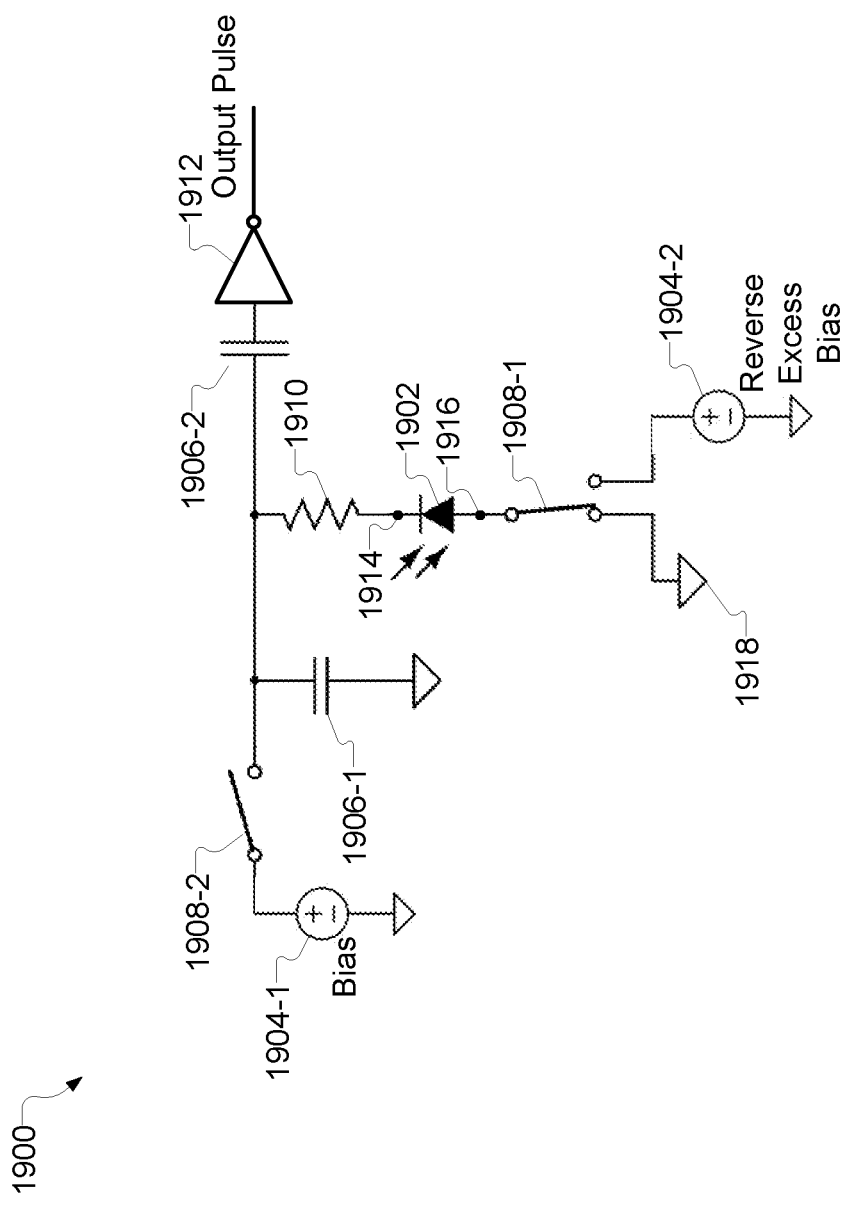
FIGS. 21-22 show exemplary switch states of the SPAD circuit of FIG. 19A.

While in the switch state shown in FIG. 19A, voltage source 1904-1 charges capacitor 1906-1 with the bias voltage. When control circuit 1006 detects that capacitor 1906-1 is fully charged with the bias voltage (Yes; decision block 2004), control circuit 2006 disconnects voltage source 1904-1 from capacitor 1906-1 (operation 2006). This is performed by control circuit 2006 providing control logic that causes switch 1908-2 to be in the second position (i.e., open) while switch 1908-1 is still in the first position. This switch state is shown in FIG. 21.

Figure 22:
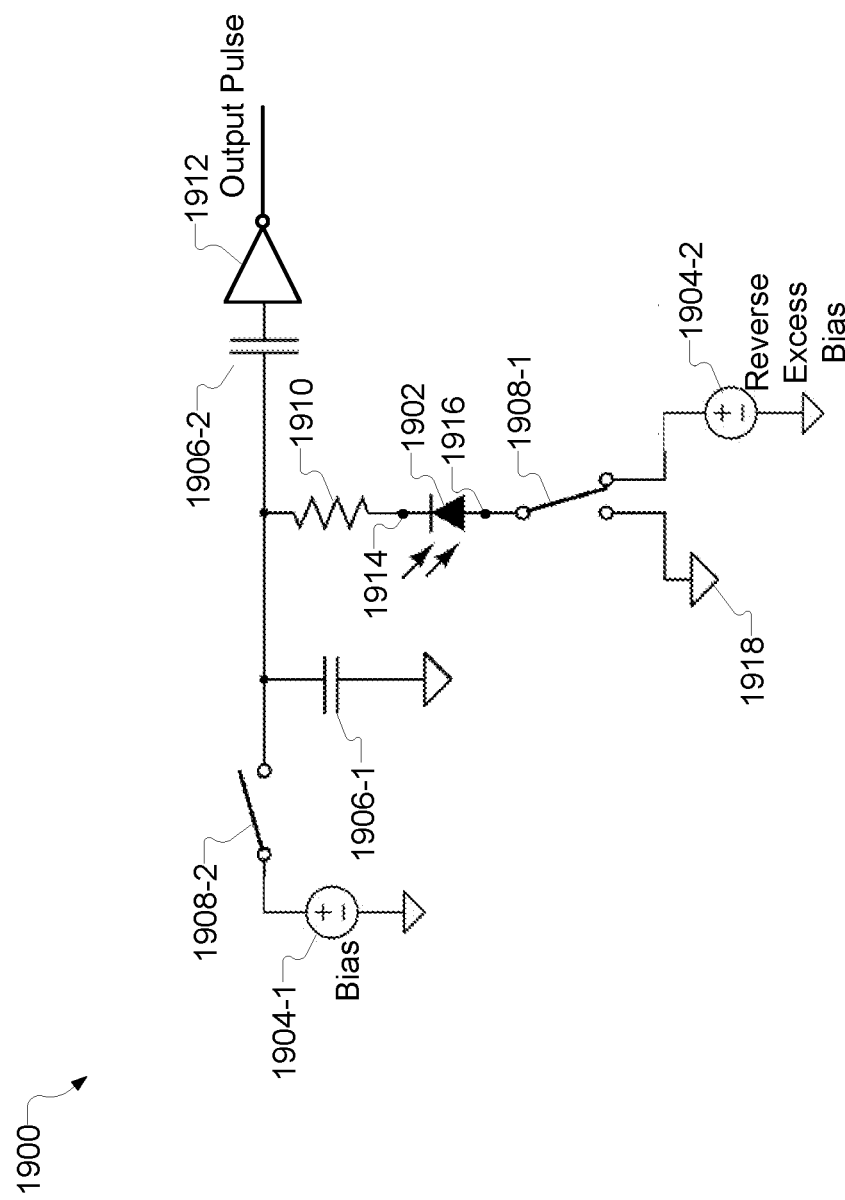
Figure 23:
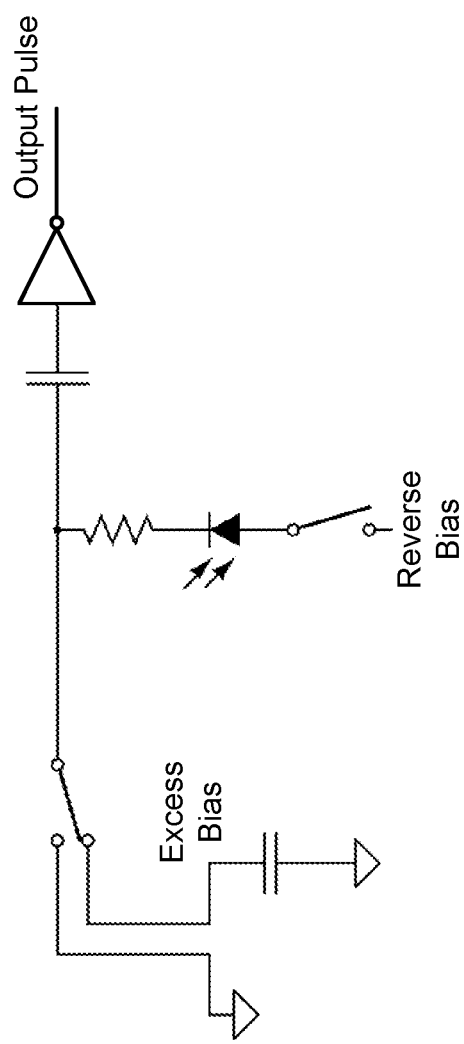
FIGS. 23-28 show alternative circuit topologies of the SPAD circuit of FIG. 19A.
Figure 24:
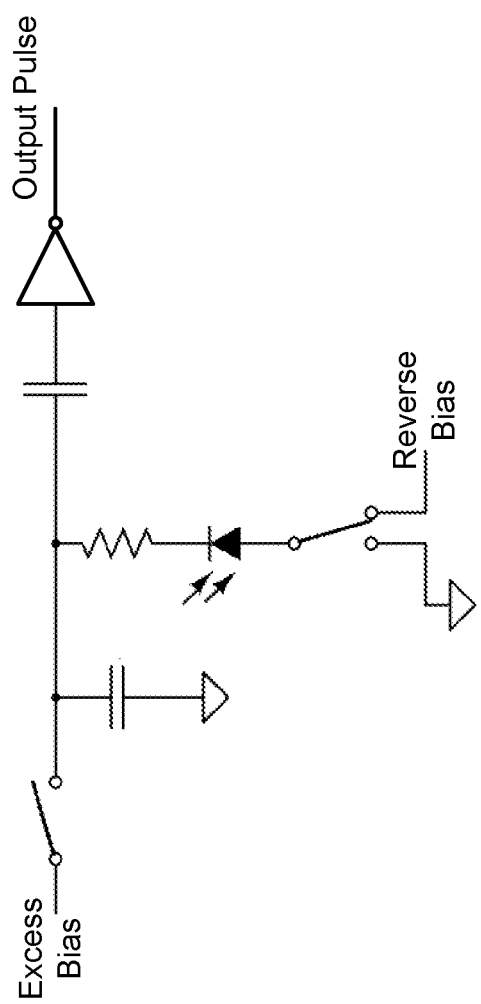
Figure 25:
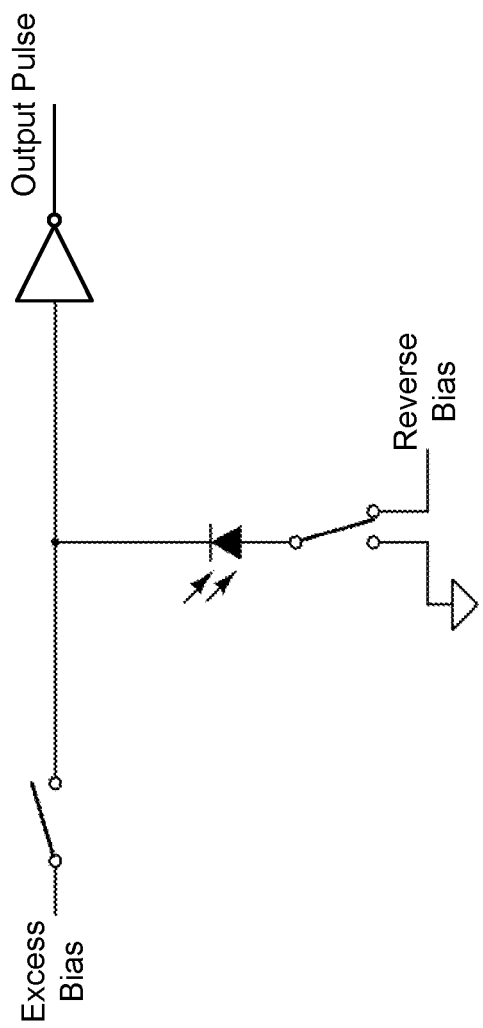
Figure 26:
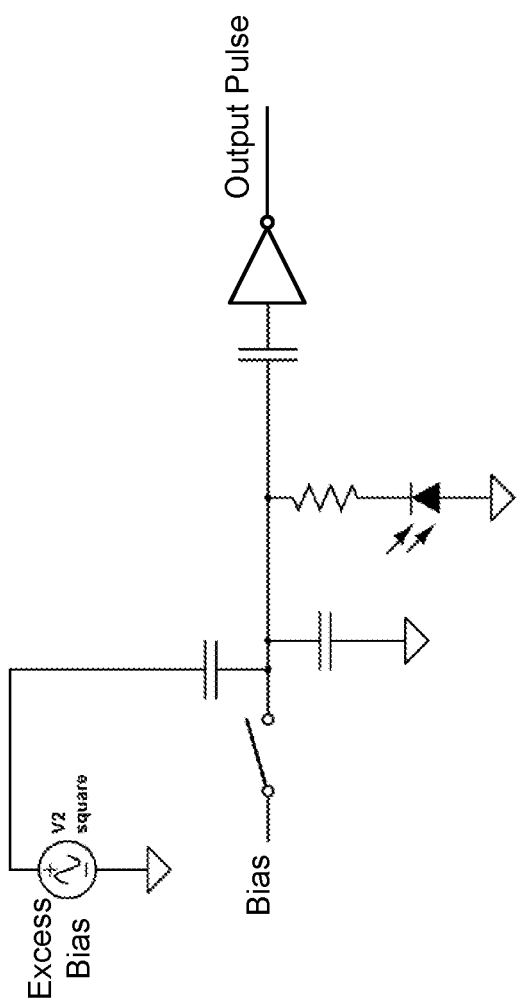
Figure 27:
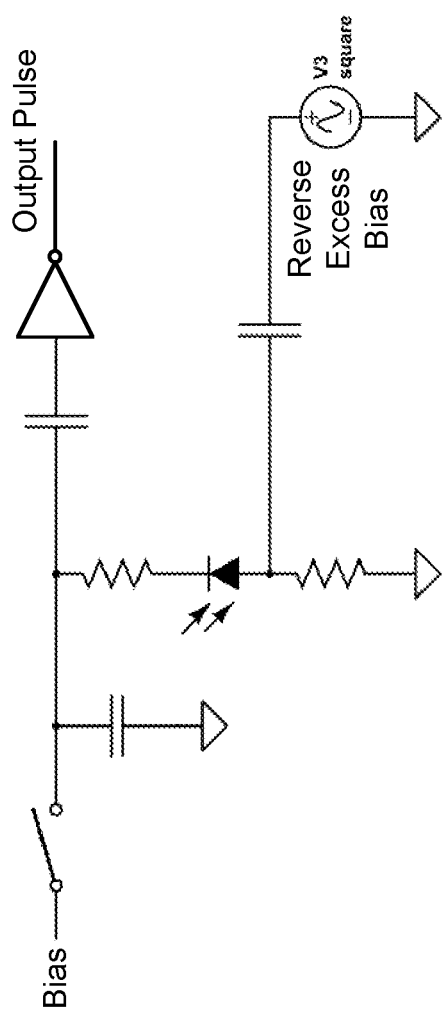
Figure 28:
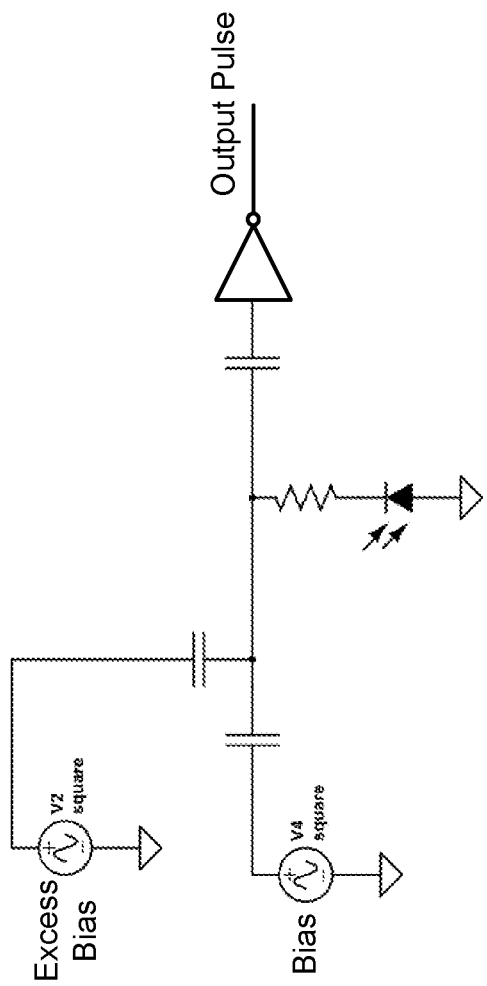

In operation 2008, control circuit 1006 puts SPAD 1902 in an armed state while capacitor 1906-1 is charged with the bias voltage. To this end, control circuit 1006 provides control logic that causes switch 1908-1 to be in the second position (i.e., open) to connect input node 1916 of SPAD 1902 to voltage source 1904-2. The control logic also keeps switch 1908-2 in the second position to keep voltage source 1904-1 disconnected from capacitor 1906-1. This switch state is shown in FIG. 22. While in the switch state shown in FIG. 22, SPAD 1902 is armed because the voltage across SPAD 1902 is higher than the breakdown voltage of SPAD 1902.

As described above, control circuit 1006 may arm and disarm SPAD 1902 in accordance with a programmable gate delay and a programmable gate width. Accordingly, if control circuit 1006 detects that the programmable gate width is met (i.e., that the predetermined time specified by the programmable gate width has expired) (Yes; decision block 2010), control circuit 1006 puts SPAD 1902 back in the disarmed state (operation 2012) by causing switch 2008-1 to be in the first position to connect input node 1916 of SPAD 1902 to ground 1918. The process shown in FIG. 20 may be repeated for subsequent light pulses.

Once SPAD 1902 has been put in the armed state, a photon from the light pulse may initiate an avalanche within SPAD 1902. As described above, SPAD 1902 draws current from capacitor 1906-1 while the avalanche is occurring, which decreases the voltage at output node 1916. When the voltage at output node 1916 drops below a certain value, inverter 1912 generates an output pulse. TDC 1008 may process the output pulse as described above.

The various components included in SPAD circuit 1900 may be implemented in any suitable manner. For example, switches 1908 may each be implemented by any suitable switch circuitry, such as the switch circuitry shown in FIGS. 17A-17F. Inverter 1912 may be implemented by the circuitry shown in FIG. 18A. Comparator 1920 may be implemented by the circuitry shown in FIG. 18B.

In some examples, inverter 1912 and comparator 1920 may be omitted from SPAD circuit 1900. In these examples, the output from SPAD 1902 is provided as the input to TDC 1008.

SPAD circuit 1910 may be implemented by any of a number of alternative circuit topologies. For example, FIGS. 23-28 show alternative circuit topologies of SPAD circuit 1910. In particular, the circuit topology of FIG. 25 does not include a capacitor that gates the SPAD. Rather, the parasitic capacitance of the SPAD is charged with an excess bias voltage and used to gate the SPAD. This may be advantageous in configurations where space limitations limit the number of components that can be included in SPAD circuit 1910.

Figure 29:
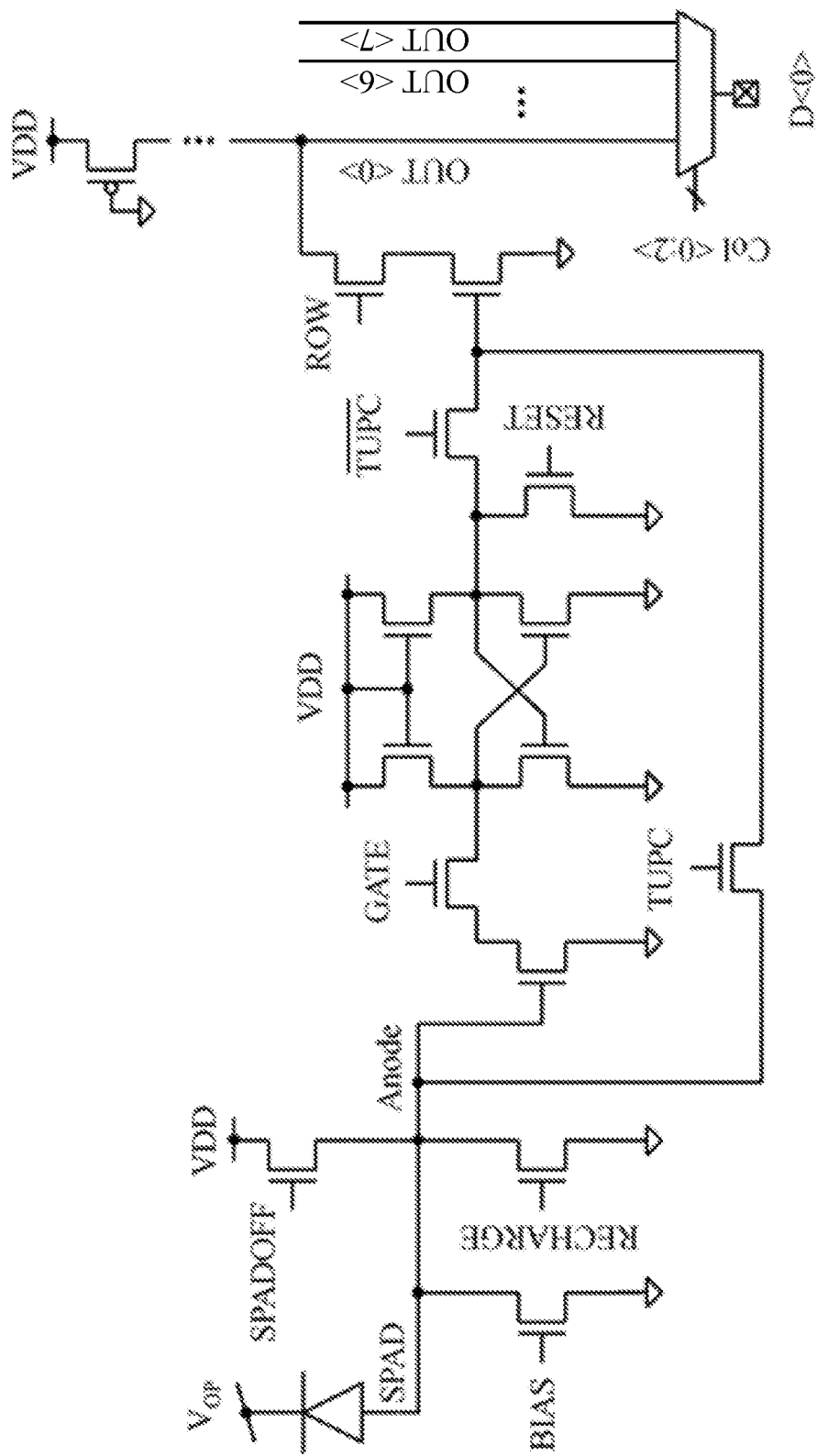
FIGS. 29-31 show other exemplary SPAD circuits that may be used in photodetector architectures described herein.
Figure 30:
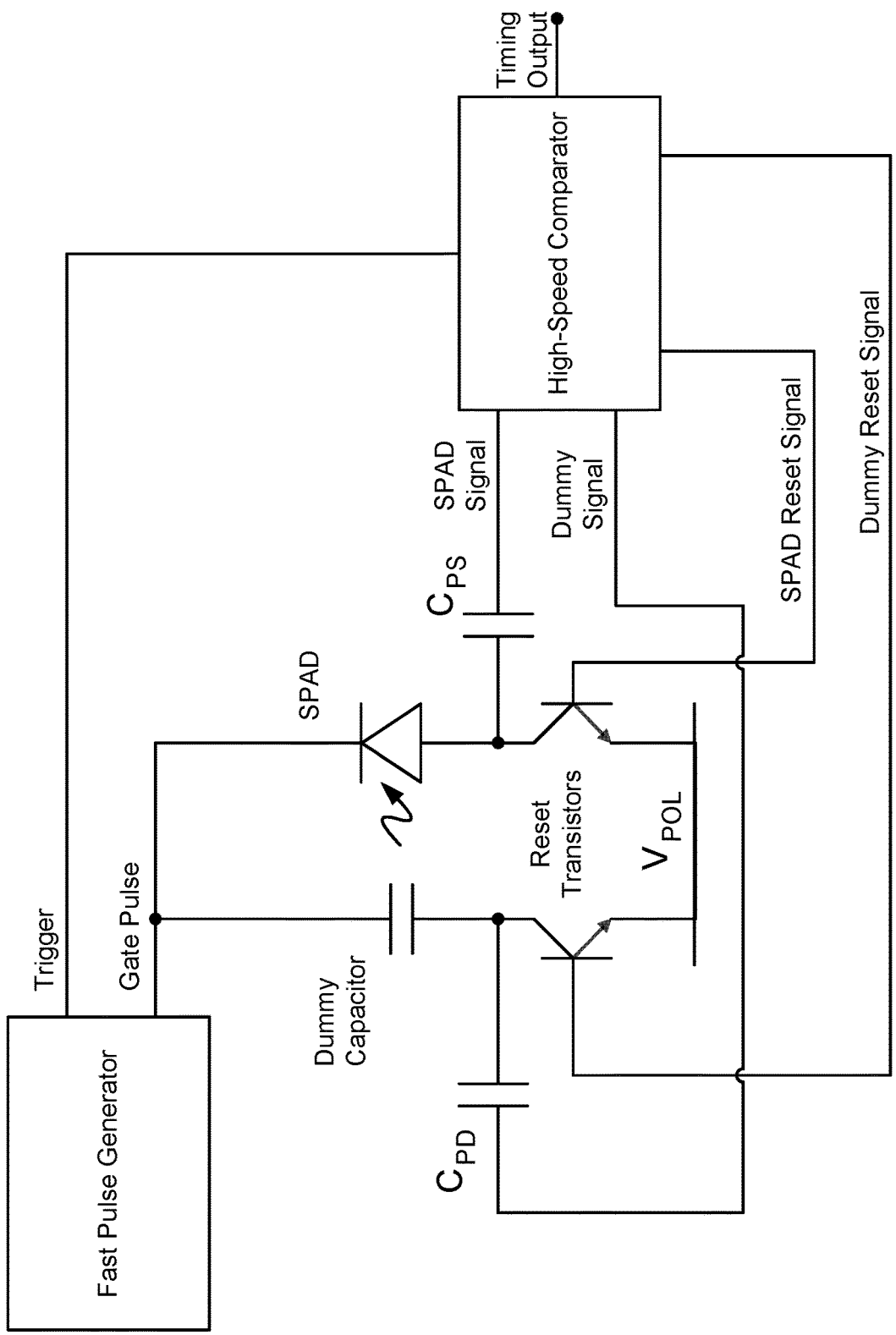
Figure 31:
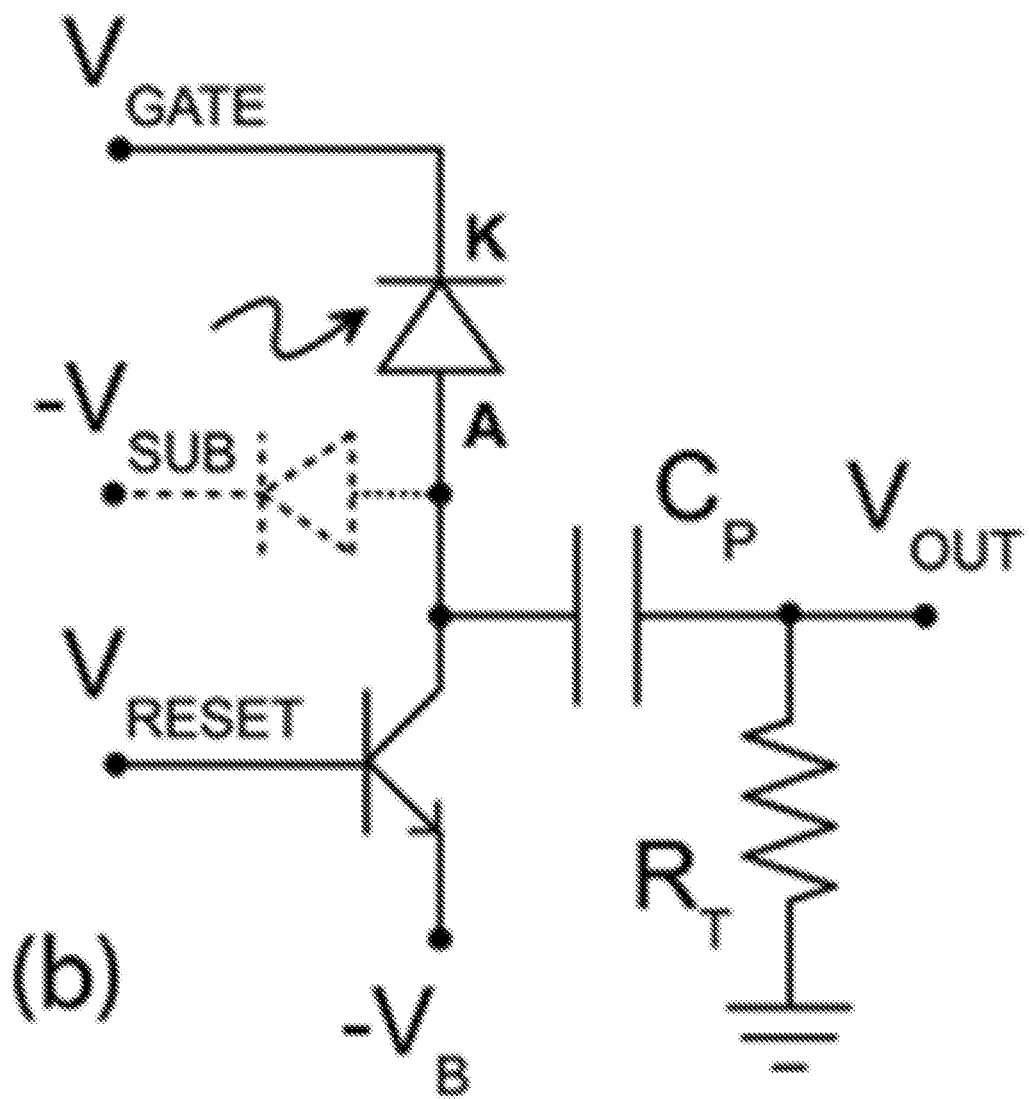

FIGS. 29-31 show other exemplary SPAD circuit topologies for SPAD circuits described herein. In particular, the circuit topologies of FIGS. 29-31 may be used in stacked photodetector assemblies as described above. Each topology shows a SPAD, which may be implemented on a first wafer configured to minimize absorption of photons while the SPAD is in a disarmed state. The remainder of the circuit may be implemented as fast gating circuits either on the first wafer or on a second wafer configured to provide structural support for the first wafer.

In the preceding description, various exemplary embodiments have been described with reference to the accompanying drawings. It will, however, be evident that various modifications and changes may be made thereto, and additional embodiments may be implemented, without departing from the scope of the invention as set forth in the claims that follow. For example, certain features of one embodiment described herein may be combined with or substituted for features of another embodiment described herein. The description and drawings are accordingly to be regarded in an illustrative rather than a restrictive sense.

What is claimed is:

1. A stacked photodetector assembly comprising:
a first wafer including a single photon avalanche diode (SPAD), the first wafer having a thickness T1 configured to minimize absorption by the first wafer of photons included in light incident upon the first wafer while the SPAD is in a disarmed state; and a second wafer having a thickness T2 including a fast gating circuit electrically coupled to the SPAD and configured to arm and disarm the SPAD, the second wafer bonded to the first wafer in a stacked configuration;

wherein the fast gating circuit includes a capacitor configured to:
be charged, while the SPAD is in the disarmed state, with a bias voltage by a voltage source, and
supply, while the SPAD is in an armed state, the bias voltage to the SPAD such that a voltage across the SPAD is greater than a breakdown voltage of the SPAD.

2. The stacked photodetector assembly of claim 1, wherein the light comprises near infrared light.

3. The stacked photodetector assembly of claim 1, wherein the thickness T1 of the first wafer is less than 10 microns.

4. The stacked photodetector assembly of claim 1, wherein the thickness T2 of the second wafer is greater than 250 microns to provide structural support for the first wafer.

5. The stacked photodetector assembly of claim 1, wherein the fast gating circuit is electrically isolated from the SPAD.

6. The stacked photodetector assembly of claim 1, wherein the SPAD is a backside illuminated SPAD.

7. The stacked photodetector assembly of claim 1, further comprising a reflective mask on the first wafer and configured to block light outside of an active region of the SPAD.

8. The stacked photodetector assembly of claim 1, wherein:
the first wafer includes a plurality of other SPADs; and
the second wafer includes a plurality of respective other fast gating circuits electrically coupled to each of the plurality of other SPADs.

9. The stacked photodetector assembly of claim 1, wherein the capacitor supplies the bias voltage to the SPAD while the capacitor is disconnected from the voltage source.

10. The stacked photodetector assembly of claim 1, further comprising:
an additional voltage source connected to an input node of the SPAD and configured to supply a reverse bias voltage at the input node, the reverse bias voltage having a magnitude that is equal to or less than the breakdown voltage of the SPAD, wherein the voltage source is configured to selectively connect to the capacitor to charge the capacitor with the bias voltage, the bias voltage being an excess bias voltage that has a magnitude that is less than the magnitude of the reverse bias voltage supplied by the additional voltage source; and
a switch configuration configured to put the SPAD into the armed state by connecting the capacitor to an output node of the SPAD while the capacitor is charged with the excess bias voltage and while the capacitor is disconnected from the voltage source;
wherein, when the capacitor is connected to the SPAD, the capacitor supplies the excess bias voltage to the SPAD such that a voltage across the SPAD is greater than the breakdown voltage.

11. The stacked photodetector assembly of claim 1, wherein:
the capacitor is connected to the SPAD;
the voltage source is configured to selectively connect to the capacitor to charge the capacitor with the bias voltage, the bias voltage having a magnitude that is equal to or less than a breakdown voltage of the SPAD; and the fast gating circuit further comprises:
an additional voltage source configured to supply a reverse excess bias voltage having a magnitude that is less than the magnitude of the bias voltage; and
a switch configuration configured to put the SPAD into the armed state by connecting the additional voltage source to an input node of the SPAD while the capacitor is both charged with the bias voltage and disconnected from the voltage source.

12. The stacked photodetector assembly of claim 1, wherein the first wafer is fabricated as a silicon on insulator wafer.

13. A stacked photodetector assembly comprising:
a first wafer including
a single photon avalanche diode (SPAD), and
a fast gating circuit electrically coupled to the SPAD and configured to arm and disarm the SPAD,
the first wafer having a thickness T1 configured to minimize absorption by the first wafer of photons included in light incident upon the first wafer while the SPAD is in a disarmed state; and
a second wafer having a thickness T2 bonded to the first wafer in a stacked configuration and configured to provide structural support for the first wafer, the second wafer not including circuitry configured to control the SPAD.

14. The stacked photodetector assembly of claim 13, wherein the light comprises near infrared light.

15. The stacked photodetector assembly of claim 13, wherein the thickness T1 of the first wafer is less than 10 microns.

16. The stacked photodetector assembly of claim 13, wherein the fast gating circuit includes a capacitor configured to:
be charged, while the SPAD is in the disarmed state, with a bias voltage by a voltage source, and
supply, while the SPAD is in an armed state, the bias voltage to an output node of the SPAD such that a voltage across the SPAD is greater than a breakdown voltage of the SPAD.

17. A stacked photodetector assembly comprising:
a single photon avalanche diode (SPAD);
a fast gating circuit electrically coupled to the SPAD and configured to arm and disarm the SPAD;
a first wafer including the SPAD and the fast gating circuit, the first wafer having a thickness T1 configured to minimize absorption of photons included in light incident upon the first wafer while the SPAD is in a disarmed state; and
a handle wafer having a thickness T2 bonded to the first wafer in a stacked configuration.

18. The stacked photodetector assembly of claim 17, wherein the fast gating circuit includes a capacitor configured to:
be charged, while the SPAD is in the disarmed state, with a bias voltage by a voltage source, and
supply, while the SPAD is in an armed state, the bias voltage to an output node of the SPAD such that a voltage across the SPAD is greater than a breakdown voltage of the SPAD.

19. A stacked photodetector assembly comprising:
a single photon avalanche diode (SPAD);
a fast gating circuit electrically coupled to the SPAD and configured to arm and disarm the SPAD;

a first wafer including the SPAD, the first wafer having a thickness T1 configured to minimize absorption of photons included in light incident upon the first wafer while the SPAD is in a disarmed state; and a second wafer having a thickness T2 bonded to the first wafer in a stacked configuration;

wherein the fast gating circuit includes a capacitor configured to:

be charged, while the SPAD is in the disarmed state, with a bias voltage by a voltage source, and supply, while the SPAD is in an armed state, the bias voltage to an output node of the SPAD such that a voltage across the SPAD is greater than a breakdown voltage of the SPAD.

20. The stacked photodetector assembly of claim 19, wherein the second wafer includes the fast gating circuit.

21. The stacked photodetector assembly of claim 19, wherein the first wafer includes the fast gating circuit.

* * * * *